United States Patent
Kim et al.

(10) Patent No.: US 11,876,019 B2
(45) Date of Patent: Jan. 16, 2024

(54) SEMICONDUCTOR DEVICES AND METHODS OF FORMING THE SAME

(71) Applicant: Samsung Electronics Co., Ltd., Suwon-si (KR)

(72) Inventors: Sung-Min Kim, Incheon (KR); Sunhom Steve Paak, Seoul (KR); Heon-Jong Shin, Yongin-si (KR); Dong-Ho Cha, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 147 days.

(21) Appl. No.: 17/523,223

(22) Filed: Nov. 10, 2021

(65) Prior Publication Data

US 2022/0068718 A1 Mar. 3, 2022

Related U.S. Application Data

(63) Continuation of application No. 16/833,885, filed on Mar. 30, 2020, now Pat. No. 11,201,086, which is a continuation of application No. 15/903,718, filed on Feb. 23, 2018, now Pat. No. 10,643,898, which is a
(Continued)

(30) Foreign Application Priority Data

May 13, 2015 (KR) ........................ 10-2015-0066565

(51) Int. Cl.
*H01L 27/088* (2006.01)
*H01L 21/8234* (2006.01)

(52) U.S. Cl.
CPC ............... *H01L 21/823431* (2013.01); *H01L 21/823481* (2013.01)

(58) Field of Classification Search
CPC ................................................ H01L 27/0886
See application file for complete search history.

(56) References Cited

U.S. PATENT DOCUMENTS

| 5,473,186 A | 12/1995 | Morita |
| 7,884,440 B2 | 2/2011 | Chung |
| 8,431,466 B2 | 4/2013 | Lin et al. |

(Continued)

FOREIGN PATENT DOCUMENTS

| CN | 102099902 A | 6/2011 |
| KR | 20070105843 A | 10/2007 |

(Continued)

*Primary Examiner* — Christopher A Johnson
(74) *Attorney, Agent, or Firm* — Myers Bigel, P.A.

(57) ABSTRACT

Semiconductor devices and methods of forming the semiconductor devices are provided. The methods may include forming a fin, forming a first device isolating layer on a side of the fin, forming a second device isolating layer extending through the first device isolating layer, forming first and second gates traversing the fin and forming a third device isolating layer between the first and second gates. The first device isolating layer may include a first material and a lowermost surface at a first depth. The second device isolating layer may include a second material and a lowermost surface at a second depth greater than the first depth. The third device isolating layer may extend into the fin, may include a lowermost surface at a third depth less than the first depth and a third material different from the first and the second materials.

19 Claims, 25 Drawing Sheets

Related U.S. Application Data continuation of application No. 15/061,200, filed on Mar. 4, 2016, now Pat. No. 9,905,468.

(56) References Cited

U.S. PATENT DOCUMENTS

| | | |
|---|---|---|
| 8,461,008 B2 | 6/2013 | Cho |
| 8,765,546 B1 | 7/2014 | Hung et al. |
| 8,846,465 B2 | 9/2014 | Lee et al. |
| 8,853,091 B2 | 10/2014 | Sato et al. |
| 8,878,308 B2 | 11/2014 | Chen et al. |
| 2002/0001889 A1 | 1/2002 | Kim et al. |
| 2005/0019993 A1 | 1/2005 | Lee et al. |
| 2007/0134884 A1 | 6/2007 | Kim et al. |
| 2007/0202700 A1 | 8/2007 | Leucke et al. |
| 2011/0062509 A1 | 3/2011 | Kato et al. |
| 2013/0277720 A1 | 10/2013 | Kim et al. |
| 2014/0117454 A1 | 5/2014 | Liu et al. |
| 2014/0264572 A1 | 9/2014 | Kim et al. |
| 2014/0315371 A1 | 10/2014 | Cai et al. |
| 2015/0137308 A1 | 5/2015 | Akarvardar et al. |
| 2015/0380316 A1 | 12/2015 | Yu et al. |
| 2016/0111336 A1 | 4/2016 | Chang et al. |
| 2016/0155739 A1* | 6/2016 | Ting .................. H01L 29/6656 438/283 |

FOREIGN PATENT DOCUMENTS

| | | |
|---|---|---|
| KR | 10-2011-0041993 A | 4/2011 |
| KR | 20110049806 A | 5/2011 |
| KR | 10-2012-0015368 A | 2/2012 |
| KR | 10-2014-0053753 A | 5/2014 |
| KR | 10-2014-0113141 A | 9/2014 |

* cited by examiner

1200

1300

1400

SEMICONDUCTOR DEVICES AND METHODS OF FORMING THE SAME

CROSS-REFERENCE TO RELATED APPLICATION

This application is a continuation of U.S. patent application Ser. No. 16/833,885, filed Mar. 30, 2020, which is a continuation of U.S. patent application Ser. No. 15/903,718, filed Feb. 23, 2018, now U.S. Pat. No. 10,643,898, which is a continuation of U.S. patent application Ser. No. 15/061,200, filed Mar. 4, 2016, now U.S. Pat. No. 9,905,468, which claims priority under 35 § 119 to Korean Patent Application No. 10-2015-0066565, filed on May 13, 2015, in the Korean Intellectual Property Office, the disclosures of which are hereby incorporated by reference in their entireties.

BACKGROUND

Example embodiments of the present disclosure relate to semiconductor devices and methods forming the semiconductor devices.

Multi-gate transistors may be used to increase density of semiconductor devices. Multi-gate transistor may include a silicon body in a fin or nanowire shape and a gate on a surface of the silicon body.

Multi-gate transistors may allow forming a small device having high density by using a three-dimensional channel. Further, multi-gate transistor may enhance current control capability without increasing a gate length and thus may effectively control short channel effect (SCE).

SUMMARY

Example embodiments provide semiconductor devices with enhanced device isolation characteristics.

Example embodiments also provide methods of forming semiconductor devices with enhanced device isolation characteristics.

A semiconductor device may include a first trench of a first depth defining a fin, a second trench of a second depth that may be greater than the first depth and a first gate and a second gate on the fin. The first gate and the second gate may traverse the fin and being adjacent each other. The semiconductor device may also include a third trench in the fin and between the first gate and the second gate and a first device isolating layer, a second device isolating layer and a third device isolating layer in the first trench, the second trench and the third trench, respectively. The third trench may have a third depth that may be less the first depth, and the first device isolating layer, the second device isolating layer and the third device isolating layer may include materials different from one another.

According to various embodiments, the first device isolating layer may include a Tonen SilaZene (TOSZ) or Towable chemical vapor deposition (FCVD) oxide, and the second device isolating layer may include a high density plasma (HDP) oxide or an undoped silicate glass (USG) oxide.

In various embodiments, the third device isolating layer may include nitride.

In various embodiments, the third device isolating layer may include the TOSZ or FCVD oxide and may have a lower etching resistance than that of the first device isolating layer.

According to various embodiments, the first device isolating layer may have superior gap fill properties to the second device isolating layer.

According to various embodiments, the second device isolating layer may have a lower shrink rate than those of the first device isolating layer and the third device isolating layer.

In various embodiments, the third device isolating layer may have a lower etching resistance than that of the first device isolating layer.

According to various embodiments, an upper portion of the second device isolating layer may be in direct contact with the first device isolating layer.

In various embodiments, the semiconductor device may further include a fourth device isolating layer on the third device isolating layer and between the first gate and the second gate. The fourth device isolating layer may include a first region and a second region, and a width of the first region may be different from that of the second region.

In various embodiments, the second region may be between the third device isolating layer and the first region, and the width of the first region may be greater than that of the second region.

A semiconductor device may include a first trench of a first depth defining a fin, a second trench overlapping with the first trench in plan view and having a second depth greater than the first depth, a first metal gate and a second metal gate on the fin and source/drain regions in the fin and on respective sides of the first metal gate and the second metal gate. The first metal gate and the second metal gate may traverse the fin and being adjacent each other. The semiconductor device may also include a third trench in the fin and between the first metal gate and the second metal gate and a first device isolating layer, a second device isolating layer and a third device isolating layer in the first trench, the second trench and the third trench, respectively. The third trench may have a third depth that may be greater than a depth of the source/drain regions and less than the first depth. An upper portion of the second device isolating layer may be in direct contact with the first device isolating layer.

A method of fabricating a semiconductor device may include forming a fin by forming a first trench of a first depth by etching a substrate, forming a first device isolating layer in the first trench, forming a second trench of a second depth that may be greater than the first depth by etching the first device isolating layer and the substrate, forming a second device isolating layer in the second trench, forming a plurality of dummy gates on the fin, forming a third trench of a third depth that may be less than the first depth by etching at least one of the dummy gates and the fin and forming a third device isolating layer in the third trench.

According to various embodiments, the first device isolating layer, the second device isolating layer and the third device isolating layer may include materials different from one another.

In various embodiments, the first device isolating layer may include a Tonen SilaZene (TOSZ) or flowable chemical vapor deposition (FCVD) oxide, and the second device isolating layer may include a high density plasma (HDP) oxide or an undoped silicate glass (IJSG) oxide.

According to various embodiments, the third device isolating layer may include nitride.

According to various embodiments, the third device isolating layer may include the TOSZ or FCVD oxide and may have a lower etching resistance than that of the first device isolating layer.

In various embodiments, the method may further include performing a first annealing process at a first temperature after forming the first device isolating layer and before forming the second device isolating layer and performing a second annealing process at a second temperature that may be lower than the first temperature after forming the third device isolating layer.

In various embodiments, an upper portion of the second device isolating layer may be in direct contact with the first device isolating layer.

In various embodiments, the method may further include forming a fourth device isolating layer on the third device isolating layer. The fourth device isolating layer may include a first region and a second region, and a width of the first region may be different from that of the second region.

According to various embodiments, the second region may be between the third device isolating layer and the first region, and the width of the first region may be greater than that of the second region.

A method of forming a semiconductor device may include forming a fin protruding from a substrate, forming a first device isolating layer on a side of the fin and on the substrate and forming a second device isolating layer extending through the first device isolating layer and separating a first active region including the fin from a second active region. The second device isolating layer may include a lower portion that extends from a lower surface of the first device isolating layer into the substrate, and the second device isolating layer may include a material different from the first device isolating layer.

In various embodiments, the method may also include forming a first gate, a second gate and a third gate that traverse the fin after forming the second device isolating layer, the second gate being between the first gate and the third gate, forming first spacers, second spacers and third spacers on respective sides of the first gate, the second gate and the third gate, removing the second gate to form an opening between the second spacers and forming a third device isolating layer in the opening. The third device isolating layer may include a lower portion that may extend into the fin and a lowermost surface that may be higher than a lowermost surface of the first device isolating layer.

According to various embodiments, the third device isolating layer may include a material different from the first device isolating layer and the second device isolating layer.

According to various embodiments, the first device isolating layer may include a Tonen SilaZene (TOSZ) or flowable chemical vapor deposition (FCVD) oxide, the second device isolating layer may include a high density plasma (HDP) oxide or an undoped silicate glass (USG) oxide, and the third device isolating layer may include nitride, TOSZ or FCVD oxide.

In various embodiments, an uppermost surface of the second device isolating layer may be coplanar with an uppermost surface of the first device isolating layer.

According to various embodiments, a side of the second device isolating layer may contact the first device isolating layer.

In various embodiments, the first device isolating layer may include a Tonen SilaZene (TOSZ) or flowable chemical vapor deposition (FCVD) oxide, and the second device isolating layer may include a high density plasma (HDP) oxide or an undoped silicate glass (USG) oxide.

A method of forming a semiconductor device may include forming a fin protruding from a substrate and forming a first device isolating layer on a side of the fin. The first device isolating layer may include a lowermost surface at a first depth from an upper surface of the fin and may include a first material. The method may also include forming a second device isolating layer extending through the first device isolating layer. The second device isolating layer may include a lowermost surface at a second depth from the upper surface of the fin that may be greater than the first depth and may include a second material. The method may further include forming a first gate and a second gate traversing the fin and forming a third device isolating layer between the first gate and the second gate. The third device isolating layer may extend into the fin, may include a lowermost surface at a third depth from the upper surface of the fin that may be less than the first depth and may include a third material that may be different from the first material and the second material.

According to various embodiments, first material may include a Tonen SilaZene (TOSZ) or flowable chemical vapor deposition (FCVD) oxide, and the second material may include a high density plasma (HDP) oxide or an undoped silicate glass (USG) oxide.

In various embodiments, the third material may include nitride.

In various embodiments, the second material may have a lower shrink rate than those of the first material and the third material.

BRIEF DESCRIPTION OF THE DRAWINGS

The objects, features and advantages of the present disclosure will become more apparent to those of ordinary skill in the art by describing in detail example embodiments thereof with reference to the accompanying drawings, in which.

DETAILED DESCRIPTION

Figure 1:
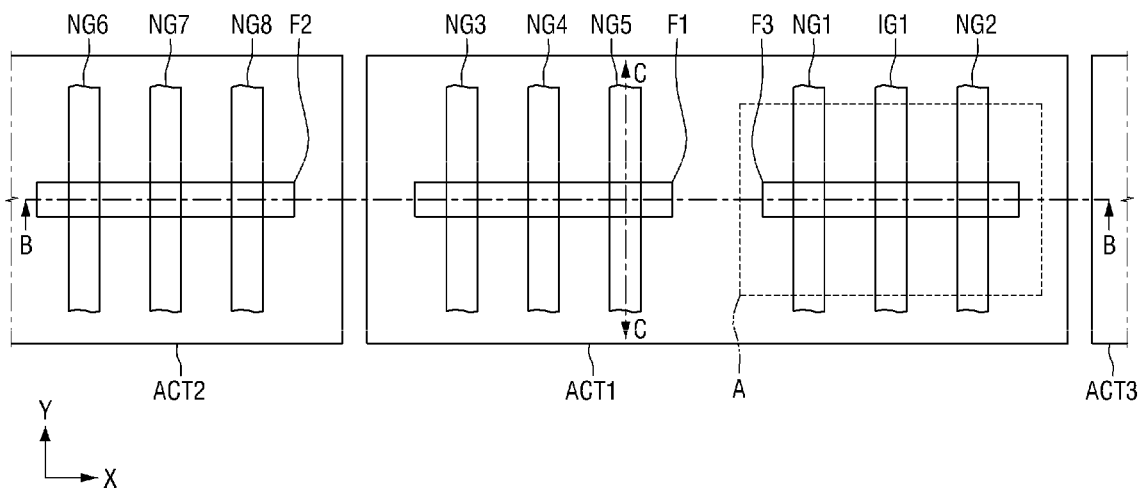
FIG. 1 is a layout diagram of a semiconductor device according to some example embodiments.

The present inventive concept will now be described more fully hereinafter with reference to the accompanying drawings, in which example embodiments are shown. The present inventive concept may, however, be embodied in different forms and should not be construed as limited to the embodiments set forth herein. Rather, these embodiments are provided so that this disclosure will be thorough and complete and will fully convey the scope of the inventive concept to those skilled in the art. The same reference numbers indicate the same components throughout the specification. In the figures, the thickness of layers and regions may be exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the inventive concept (especially in the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples or terms provided herein is intended merely to better illuminate the inventive concept and is not a limitation on the scope of the inventive concept unless otherwise specified. Further, unless defined otherwise, all terms defined in generally used dictionaries may not be interpreted in overly formal sense unless expressly so defined herein.

Figure 2:
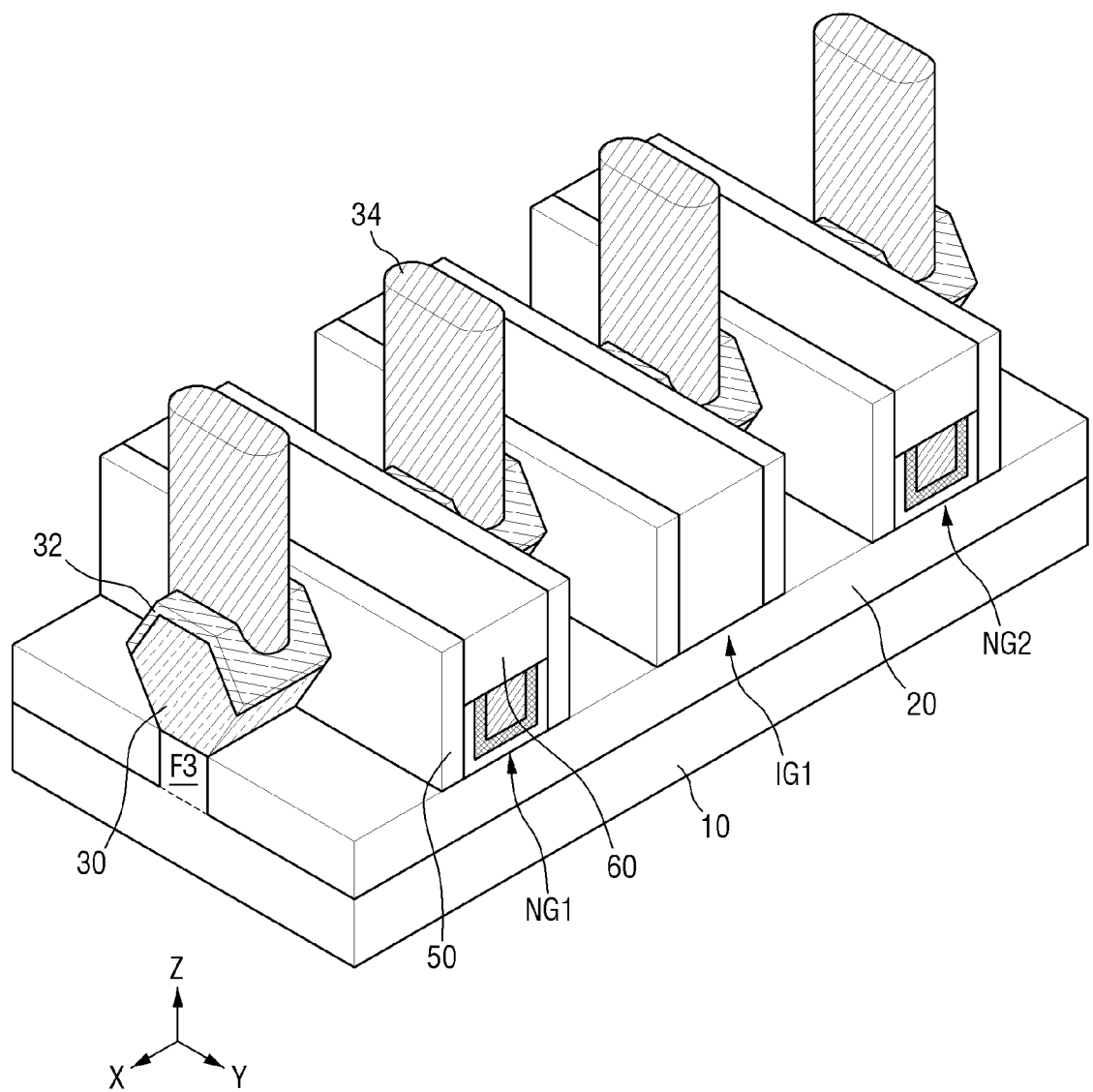
FIG. 2 is a perspective view of the area A of FIG. 1.
Figure 3:
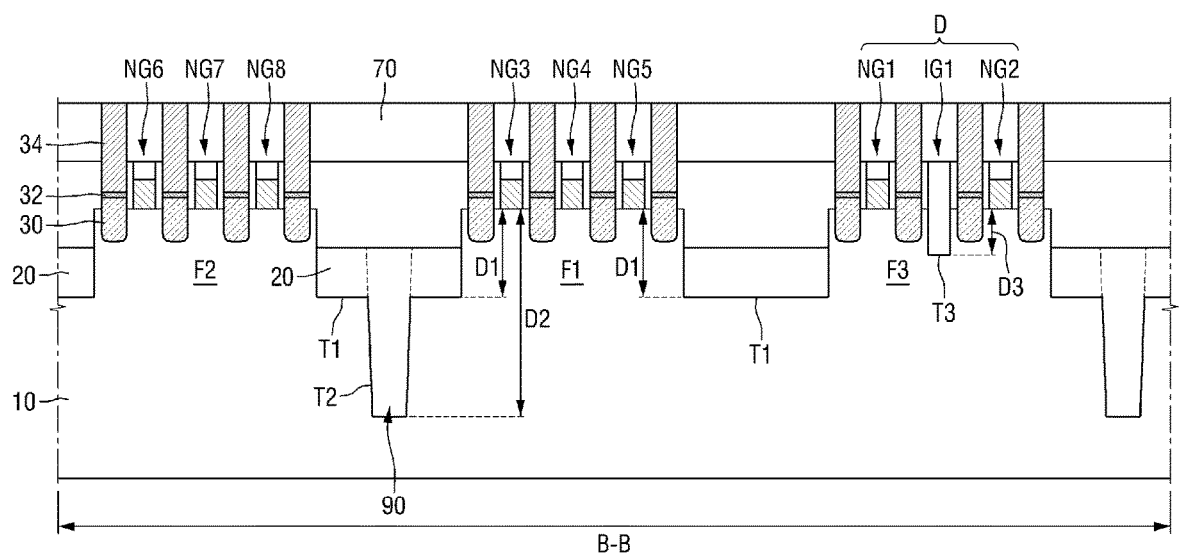
FIG. 3 is a cross-sectional view taken along the line B-B of FIG. 1.
Figure 4:
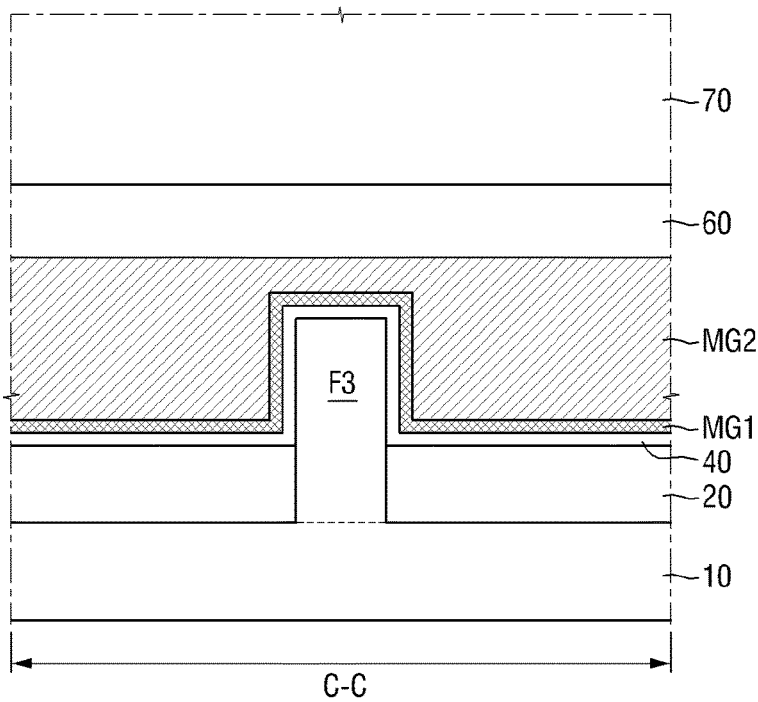
FIG. 4 is a cross-sectional view taken along the line C-C of FIG. 1.
Figure 5:
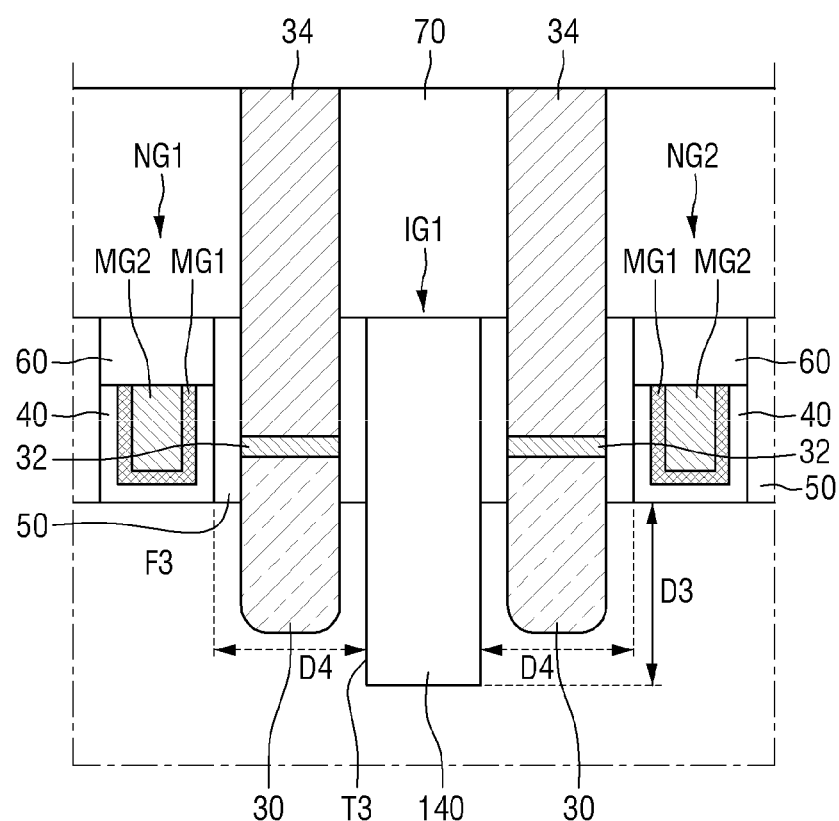
FIG. 5 is a cross-sectional view of the area D of FIG. 3.

FIG. 1 is a layout diagram of a semiconductor device according to some example embodiments. FIG. 2 is a perspective view of the area A of FIG. 1. FIG. 3 is a cross-sectional view taken along the line B-B of FIG. 1, and FIG. 4 is a cross-sectional view taken along the line C-C of FIG. 1. FIG. 5 is a cross-sectional view of the area D of FIG. 3.

Referring first to FIG. 1, a semiconductor device according to some example embodiments may include active regions ACT1, ACT2, ACT3 on a substrate 10. The substrate 10 may be formed of one or more semiconductor materials selected from Si, Ge, SiGe, GaP, GaAs, SiC, SiGeC, InAs and InP. Further, a silicon on insulator (SOI) substrate may be used. When the substrate 10 is SOI, the semiconductor device may have enhanced response speed.

Fins F1, F2, may be elongated in a first direction X. The fins F1, F2, F3 may be part of the substrate 10, and may include an epitaxial layer grown from the substrate 10. The substrate 10 and the fins F1, F2, F3 may include a same material, or different materials. For example, the substrate 10 may include Si, and the fins F1, F2, F3 may include SiGe and/or SiC), which are epitaxially grown.

As illustrated in FIG. 1, the fins F1, F2, F3 may be in rectangular shape, but example embodiments are not limited thereto. Corner portions of the fins F1, F2, F3 may be cut at a slight inclination (i.e., the corner portions may be cut to have a chamfered shape). In some embodiments, long sides of the fins F1, F2, F3 may extend in the first direction X, and short sides may extend in a second direction Y as illustrated in FIG. 1.

Two fins F1 and F3 may be formed in the active region ACT1, and one fin F2 may be formed in the active region ACT2. Although not illustrated, at least one fin may be formed also in the active region ACT3.

A plurality of metal gates NG1~NG8 and a third device isolating layer (or insulating gate) IG1 may be elongated along the second direction Y. The long sides of a plurality of metal gates NG1~NG8 and the third device isolating layer IG1 may extend in the second direction Y, and short sides may extend in the first direction X.

A plurality of metal gates NG3~NG5 may be formed on the fin F1, and a plurality of metal gates NG6~NG8 may be formed on the fin F2. The plurality of metal gates NG3~NG5 may traverse the fin F1, and the plurality of metal gates NG6~NG8 may traverse the fin F2. For convenience of explanation, FIG. 1 illustrates a fin-type transistor (i.e., single fin structure) using one fin. However, example embodiments are not limited thereto. Accordingly, in some embodiments, a fin-type transistor may include two or more fin and may have a dual fin structure or a multi fin structure. A dual fin structure includes at least one metal gate that intersects two fins.

A plurality of metal gates NG1, NG2 and a third device isolating layer IG1 may be formed on the fin F3. The third device isolating layer IG1 may be formed between the metal gates NG1, NG2 to electrically isolate the metal gates NG1, NG2 from each other. A lower portion of the third device isolating layer IG1 may extend into the fin F3. The third device isolating layer IG1 may be formed by a replacement process. Accordingly, the pitch between the third device isolating layer IG1 and an immediately-neighboring metal gate NG1 may be identical to the pitch between the third device isolating layer IG1 and an immediately-neighboring metal gate NG2. In some embodiments, the third device isolating layer IG1 may be spaced apart from the immediately-neighboring metal gate NG1 and the immediately-neighboring metal gate NG2 by the same distance as illustrated in FIG. 1.

A shallow trench isolation (STI), which defines the fins F1, F2, F3, may include a first trench of a first depth. A deep trench isolation (DTI), which defines the active regions ACT1, ACT2, ACT3, may include a second trench of a second depth which is greater than the first depth. The third device isolating layer (or insulating gate) IG1 may include a third trench of a third depth which is less than the first depth. Accordingly, the semiconductor device according to some example embodiments may include three isolation structures with different depths.

Referring to FIGS. 2 to 5, the metal gates NG1~NG8 may extend on the fins F1, F2, F3 in the second direction Y which intersects the first direction X in which the fin F1, F2, F3 are elongated. Although FIG. 2 shows that the metal gates NG1~NG8 extend in the second direction Y, example embodiments are not limited thereto. The metal gates NG1~NG8 may intersect the fins F1, F2, F3 at acute or obtuse angles. As illustrated in FIG. 2, the metal gates NG1~NG8 may be spaced from each other in the first direction X.

Each of the metal gates NG1~NG8 may include a first metal layer MG1 and a second metal layer MG2. The metal gates NG1~NG8 may be formed of two or more of the first metal layer MG1 and the second metal layer MG2 which are stacked on each other. The first metal layer MG1 may play a role of adjusting a work function, and the second metal layer MG2 may play a role of filling a space defined by the first metal layer MG1.

The first metal layer MG1 may be in such a form that it extends upwardly along an upper surface of the gate insulating layer 40 and a side surface of the second metal layer MG2 as illustrated in FIG. 5. Further, the first metal layer MG1 may extend conformally in the second direction Y, along the upper portion of the first device isolating layer 20, and the sidewall and the upper portion of the fins F1, F2, F3.

For example, the first metal layer MG1 may include at least one of TiN, TaN, TiC, TiAlC and TaC. For example, the second metal layer MG2 may include W or Al. However, example embodiments are not limited thereto, and the configurations of the first metal layer MG1 and the second metal layer MG2 may vary.

For example, the metal gates NG1~NG8 may be formed by a gate replacement process, but example embodiments are not limited thereto.

The gate insulating layer 40 may be formed on a lower portion of the metal gates NG1~NG8. The gate insulating layer 40 may include a high-k dielectric material having a higher dielectric constant than silicon oxide layer. For example, the gate insulating layer 40 may include $HfO_2$, $ZrO_2$, LaO, $Al_2O_3$ or $Ta_2O_5$, but not limited thereto.

The gate insulating layer 40 described above may be formed into a configuration which extends upwardly along upper surface of the fins F1, F2, F3, and side surfaces of the metal gates NG1~NG8. Further, the gate insulating layer 40 may extend in the second direction Y along the upper surface of the first device isolating layer 20 and the side surface and the upper surface of the fins F1, F2, F3.

A spacer 50 may be formed on at least one side of the metal gates NG1~NG8. In some example embodiments, the spacer 50 may be formed on both sides of the metal gates NG1~NG8. As illustrated in FIG. 5, an I-type spacer 50 may be formed, but example embodiments are not limited hereto. In some example embodiments, the shape of the spacer 50 may have different shapes.

For example, the spacer 50 may include a nitride layer. Specifically, the spacer 50 may include a silicon nitride layer. However, example embodiments are not limited thereto, and the spacer 50 may include material different from nitride. For example, the spacer 50 may include an oxide layer and/or an oxynitride layer.

A capping layer 60 may be disposed on the metal gates NG1~NG8. The capping layer 60 may extend in the second direction Y. The upper surface of the capping layer 60 may be substantially in a co-plane with the upper surface of the spacer 50. In other words, the height of the upper surface of the capping layer 60 and the height of the upper surface of the spacer 50 may be substantially identical to each other.

For example, the capping layer 60 may include at least one of silicon nitride layer and silicon oxynitride layer. However, example embodiments are not limited thereto, and the capping layer 60 may include different material. Further, in some example embodiments, the capping layer 60 may not be formed.

A source/drain region 30 may be disposed on both sides of the metal gates NG1~NG8. The source/drain region 30 may be disposed in the fins F1, F2, F3. That is, the source/drain region 30 may be formed in partially-etched regions of the fins F1, F2, F3.

The source/drain region 30 may be an elevated source/drain region. Accordingly, the upper surface of the source/drain region 30 may be higher than the upper surface of the fins F1, F2, F3.

In some embodiments, the semiconductor device may be a PMOS transistor, and the source/drain region 30 may include a compressive stress material. For example, the compressive stress material may be SiGe which has a lattice constant greater than Si. The compressive stress material exert a compressive stress on the fins F1, F2, F3 (i.e., channel region) under the metal gates NG1~NG8, thus enhancing mobility of the carriers in the channel regions.

In some embodiments, the semiconductor device may be a NMOS transistor, and the source/drain region 30 may include a material same as the substrate 10 or a tensile stress material. For example, when the substrate 10 is Si, the source/drain region 30 may be Si, or other material (e.g., SiC, SiP) that has a lattice constant less than Si. The high tensile stress material may exerts a tensile stress on the fins F1, F2, F3 (i.e., channel region) under the metal gates NG1~NG8, thus enhancing mobility of the carriers in the channel regions.

The source/drain region 30 described above may be formed through an epitaxial growth process, but example embodiments are not limited thereto.

A silicide layer 32 may be formed on the source/drain region 30. The silicide layer 32 may be formed along the upper surface of the source/drain region 30. The silicide layer 32 may play a role of reducing sheet resistance or contact resistance when the source/drain region 30 is contacted with a contact 34. The silicide layer 32 may include a conductive material such as, for example, Pt, Ni or Co.

The contact 34 formed on the silicide layer 32 may be formed of a conductive material. For example, the contact 34 may include W, Al or Cu, but not limited thereto.

An interlayer insulating layer 70 may cover the spacer 50 and the capping layer 60. The contact 34 may be passed through the interlayer insulating layer 70.

The semiconductor device according to some example embodiments may include a first device isolating layer 20, a second device isolating layer 90 and a third device isolating layer IG1 in a first trench T1, a second trench T2 and a third trench T3, respectively, and the first, second and third trenches T1, T2, T3 may have different depths (i.e., D1, D2 and D3) from the upper surfaces of the fins F1, F2, F3.

Still referring to FIGS. 2 and 3, the fins F1, F2, F3 may extend from the substrate 10, and the first device isolating layer 20 may partially cover the sidewall of the fins F1, F2, F3, and may expose upper portion of the fins F1, F2, F3. The first device isolating layer 20 may be on the sidewall of the fins F1, F2, F3.

The upper surface of the first device isolating layer 20 may be formed lower than the upper surface of the fins F1, F2, F3. However, example embodiments are not limited thereto. In some embodiments, the upper surface of the first device isolating layer 20 may be higher than, or at a substantially same height as the upper surface of the fins F1, F2, F3.

The first device isolating layer 20 may be formed in the first trench T1 of the first depth D1.

As illustrated in FIG. 3, the second device isolating layer 90 defines the active regions ACT1, ACT2, ACT3. The second device isolating layer 90 may separate the active region ACT1 from the active region ACT2 that is adjacent the active region ACT1.

The second device isolating layer 90 is formed in the second trench T2 of the second depth D2 that is greater than the first depth D1. The second trench T2 may be formed so as to be partially overlapped with the first trench T1 in plan view. Accordingly, the second device isolating layer 90 may be formed so as to be partially overlapped with the first device isolating layer 20 in plan view. As illustrated in FIG. 3, the first device isolating layer 20 and the second device isolating layer 90 may be overlapped with each other and may form a T shape in cross section. For example, an upper portion of the second device isolating layer 90 may be in direct contact with the first device isolating layer 20. In some embodiments, the second device isolating layer 90 may extend through the first device isolating layer 20, and a lower portion of the second device isolating layer 90 may extend beyond a lower surface of the first device isolating layer 20 as illustrated in FIG. 3. The lower portion of the second device isolating layer 90 may be in the substrate 10. Accordingly, a lowermost surface of the first device isolating layer 20 may be higher than a lowermost surface of the second device isolating layer 90. A side of the second device isolating layer 90 may contact first device isolating layer 20.

The upper surface of the second device isolating layer 90 may be coplanar with the upper surface of the first device isolating layer 20. However, example embodiments are not limited thereto. Accordingly, in some embodiments, the upper surface of the second device isolating layer 90 may be formed at a different height from the upper surface of the first device isolating layer 20.

As illustrated in FIGS. 3 and 5, the third device isolating layer IG1 may be formed between adjacent metal gates NG1, NG2 and may electrically isolate the adjacent metal gates NG1, NG2. Accordingly, the semiconductor device can have enhanced operating reliability.

The pitch between the third device isolating layer IG1 and an immediately-neighboring metal gate NG1 may be identical to the pitch between the third device isolating layer IG1 and an immediately-neighboring metal gate NG2. In some embodiments, the third device isolating layer IG1 may be formed by a replacement process. In some embodiments, a distance D4 between the third device isolating layer IG1 and the immediately-neighboring metal gate NG1 and a distance D4 between the third device isolating layer IG1 and the immediately-neighboring metal gate NG2 may be the same.

The lower surface of the third device isolating layer IG1 may be disposed higher than the lower surface of the fins F1, F2, F3. Further, the lower surface of the third device isolating layer IG1 may be disposed higher than the lower surface of the first device isolating layer 20. Further, in some example embodiments, the width of the third device isolating layer IG1 may be formed narrower than the width of the first device isolating layer 20.

The upper surface of the third device isolating layer IG1 may be coplanar with the upper surfaces of the adjacent metal gates NG1, NG2. The upper surfaces of the metal gates NG1, NG2 may be the upper surface of the capping layer 60, or the upper surface of the second metal layer MG2 when the capping layer 60 is not formed. In some embodiments, the upper surface of the third device isolating layer IG1 may be coplanar with the upper surfaces of the I-type spacers 50 of the adjacent metal gates NG1, NG2.

In some example embodiments, the first device isolating layer 20, the second device isolating layer 90 and the third device isolating layer IG1 may include materials different from each other.

As appreciated by the present inventors, various devices are present in the semiconductor device. Accordingly, various breakdown voltages (BVs) have to be met for the proper isolation of each of the devices. Further, as appreciated by the present inventors, use of one deep trench isolation would cause problems such as void or stress in subsequent processes. As a result, process margin may decrease and manufacturing process may become difficult. The semiconductor device according to some example embodiments may include device isolating layers in trenches of different depths. Accordingly, it may be possible to provide efficient isolation for the device having different BVs.

Still further, as appreciated by the present inventors, it may be necessary that the first device isolating layer 20 have a gap fill properties superior to that of the second device isolating layer 90, and the second device isolating layer 90 have a lower shrink rate than those of the first device isolating layer 20 and the third device isolating layer IG1. The third device isolating layer IG1 (or the insulating layer 140 in the third device isolating layer IG1) may have to have superior gap fill properties, considering a narrow width of the third trench T3. The third device isolating layer IG1 may include a material which does not require a high temperature treatment.

In some embodiments, the first device isolating layer 20 may include, for example, Tonen SilaZene (TOSZ) or flowable chemical vapor deposition (FCVD) oxide, and the second device isolating layer 90 may include, for example, a high density plasma (HDP) oxide or an undoped silicate glass (USG) oxide. The third device isolating layer IG1 may include, for example, nitride.

In some embodiments, TOSZ or FCVD oxide may be used for the third device isolating layer IG1. After the TOSZ or FCVD oxide is formed in the first trench annealing at high temperature (e.g., 1000° C. or above) may be performed. As a result, the first device isolating layer 20 is formed. After the TOSZ or FCVD oxide is formed in the third trench T3, annealing at low temperature (e.g., 700° C. or below) may be performed. As a result, the third device isolating layer IG1 may be formed. In some example embodiments, both the first device isolating layer 20 and the third device isolating layer IG1 may include TOSZ or FCVD oxide, annealing processes may be performed as described above, and the first device isolating layer 20 and the third device isolating layer IG1 may have different etching rates. For example, the first device isolating layer 20 may be harder than the third device isolating layer IG1, and the third device isolating layer IG1 may have a lower etching resistance than that of the first device isolating layer 20.

As explained above, the device isolation characteristics may be improved, by forming the first device isolating layer 20, the second device isolating layer 90 and the third device isolating layer IG1, each of which is formed in the trenches T1, T2, T3 having different depths.

Various forms of the third device isolating layer IG1 will be explained with reference to FIGS. 6 to 15.

Figure 6:
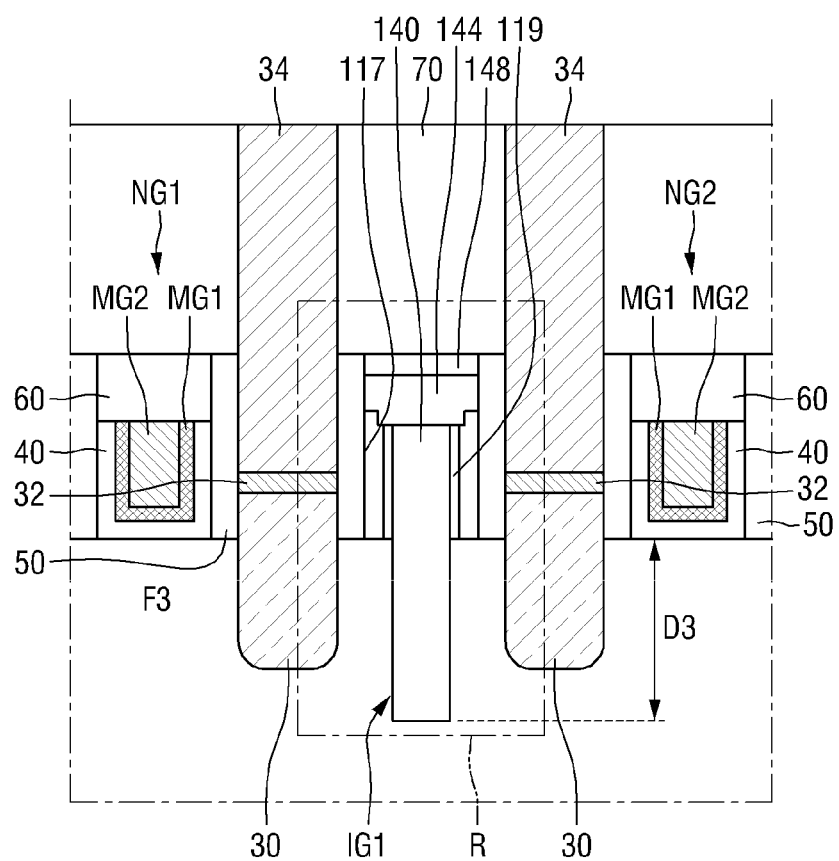
FIG. 6 is a cross-sectional view of a semiconductor device according to some example embodiments.
Figure 7:
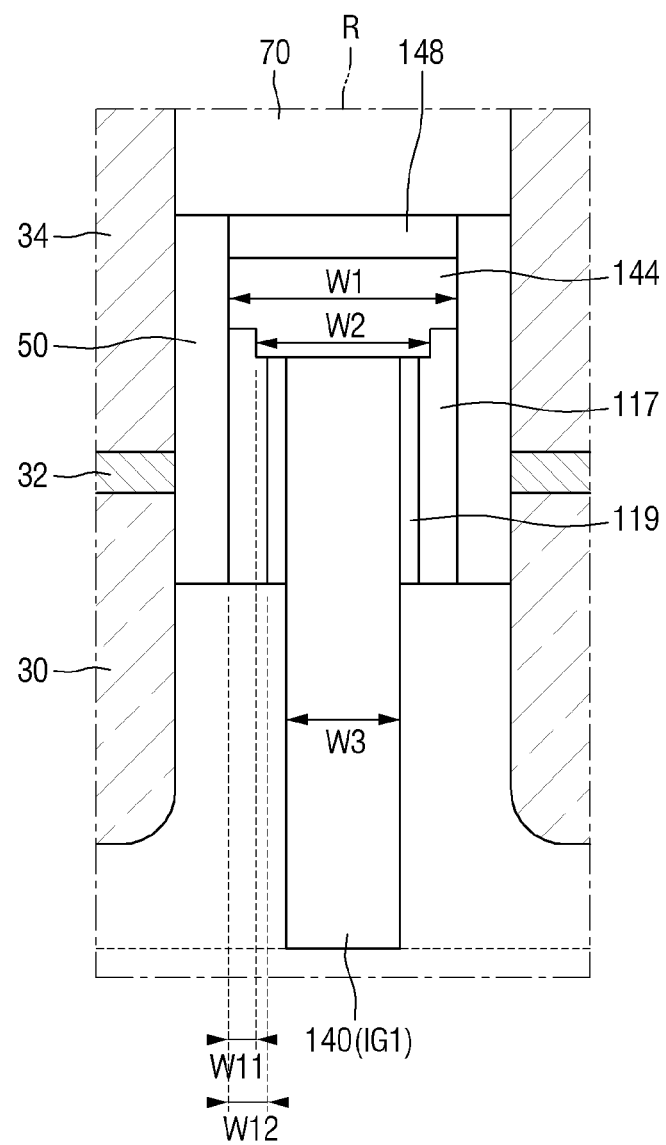
FIG. 7 is a cross-sectional view of the area R of FIG. 6.

FIG. 6 is a cross-sectional view of a semiconductor device according to some example embodiments, FIG. 7 is a cross-sectional view of the area R of FIG. 6. For convenience of explanation, differences that are not explained above with reference to FIGS. 1 to 5 will be mainly explained below.

Referring to FIGS. 6 and 7, the lower surface of the third device isolating layer 140 (or IG1) may be lower than the lower surface of the source/drain region 30. For example, the third device isolating layer 140 may include a nitride layer.

An inner spacer 119 may be formed on a side surface of the third device isolating layer 140. The inner spacer 119 may play a role of reducing or possibly preventing damage to the adjacent source/drain region 30 during forming of the third device isolating layer 140. For example, the inner spacer 119 may include an oxide layer.

A dummy spacer 117 may be formed on a side surface of the inner spacer 119. The dummy spacer 117 may include a lower region having a width W12 and an upper region having a width W11 that is less than the width W12. Accordingly, in some example embodiments, the dummy spacer 117 may have a step-wise upper surface as illustrated in FIG. 7.

The height of the upper surface of the dummy spacer 117 may be less than that of the upper surface of the spacer 50. Specifically, the height of the upper surface of the upper region of the dummy spacer 117 may be less than that of the upper surface of the spacer 50.

Further, the height of the upper surface of the dummy spacer 117 may be higher than that of the upper surface of the inner spacer 119. Specifically, the height of the upper surface of the upper region of the dummy spacer 11 may be greater than that of the upper surface of the inner spacer 119. For example, the dummy spacer 117 may include a nitride layer.

A fourth device isolating layer 144 may be formed on the third device isolating layer 140.

The fourth device isolating layer 144 may include a lower region (i.e., second region) having, a relatively smaller width W2 and an upper region (i.e., first region) having a relatively greater width W1. As illustrated in FIG. 7, the upper region of the first device isolating layer 144 may be formed on the upper surface of the dummy spacer 117, and the lower region of the first device isolating layer 144 may be formed on the side surface of the dummy spacer 117 and the upper surface of the inner spacer 119.

The widths W1, W2 of the fourth device isolating layer 144 may be greater than the width W3 of the third device isolating layer 140.

Specifically, the width W2 of the lower region of the fourth device isolating layer 144 formed on the side surface of the dummy spacer 117 and the upper surface of the inner spacer 119 may be greater than the width W3 of the third device isolating layer 140 formed on the side surface of the inner spacer 119, and the width W1 of the fourth device isolating layer 144 formed on the upper surface of the dummy spacer 117 may be greater than the width W2 of the lower region of the fourth device isolating layer 144.

Shapes of the third and the fourth device isolating layers 140, 144 may enhance gap fill properties during forming of the third and the fourth device isolating layers 140, 144.

For example, the fourth device isolating layer 144 may include an oxide layer.

A protective layer 148 may be formed on the fourth device isolating layer 144. The protective layer 148 may play a role of protecting the underlying insulating layers during the process of manufacturing the semiconductor device according to example embodiments. For example, the protective layer 148 may include a nitride layer.

Figure 8:
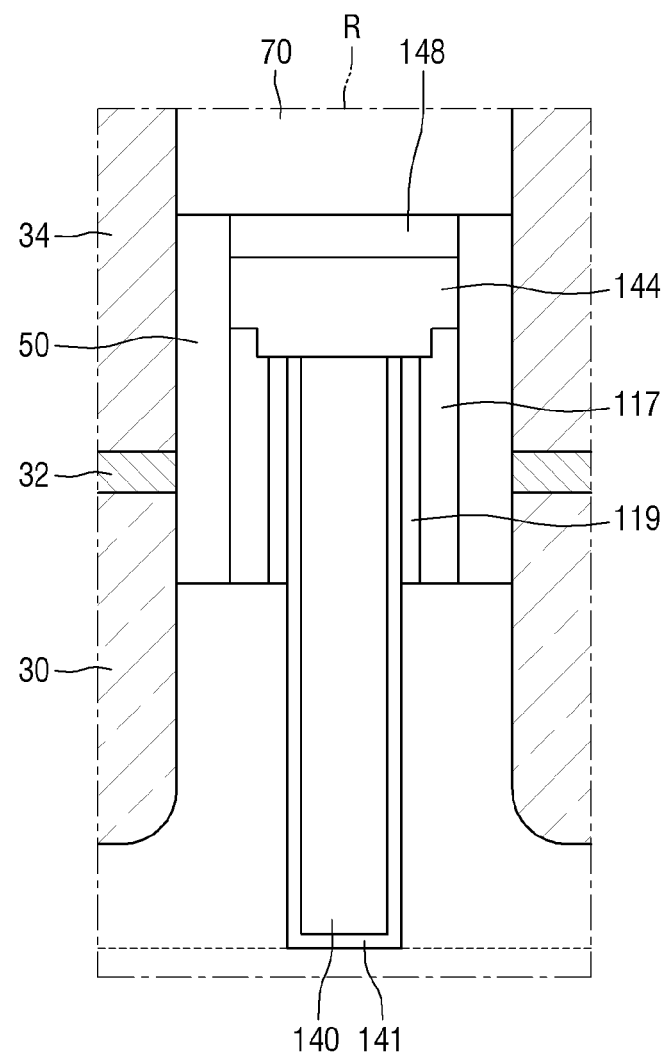
FIG. 8 is a cross-sectional view of a semiconductor device according to some example embodiments.

FIG. 8 is a cross-sectional view of a semiconductor device according to some example embodiments. For convenience of explanation, differences that are not explained above with reference to FIGS. 1 to 7 will be mainly explained below.

Referring to FIG. 8, a liner 141 may be formed in the third trench T3, and then the third device isolating layer IG1 (or 140) may be formed on the liner 141. For example, the liner 141 may be an oxide layer, and the third device isolating layer 140 may be a nitride layer. As illustrated, the liner 141 may be formed to upwardly extend along the side surface of the third device isolating layer 140. The third device isolating layer 140 may fill the space defined by the liner 141.

Figure 9:
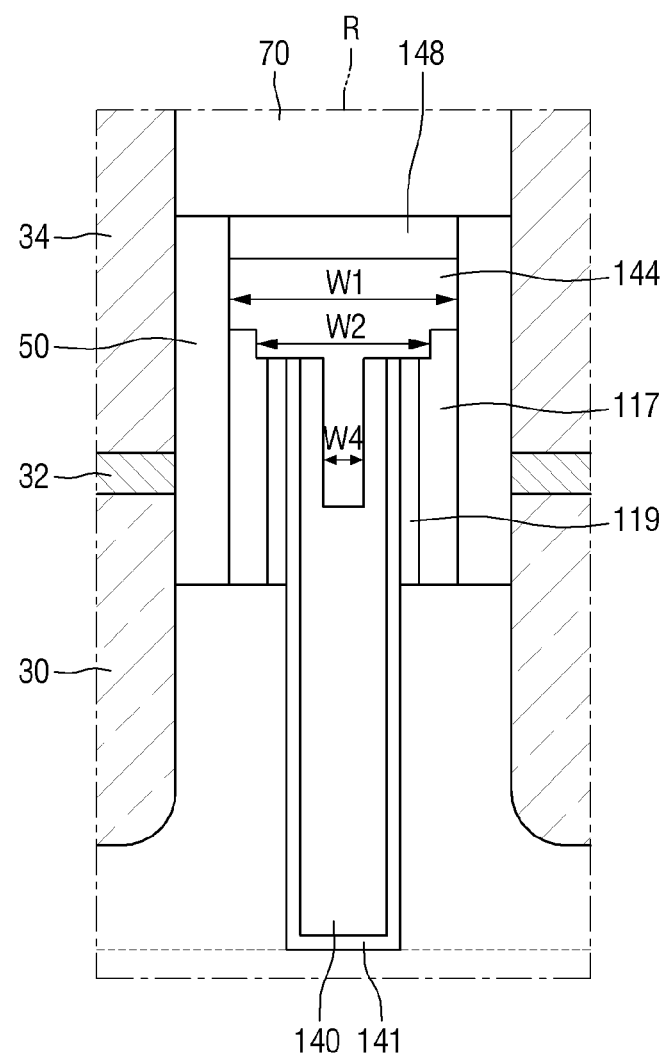
FIG. 9 is a cross-sectional view of a semiconductor device according to some example embodiments.

FIG. 9 is a cross-sectional view of a semiconductor device according to some example embodiments. For convenience of explanation, differences that are not explained above with reference to FIGS. 1 to 8 will be mainly explained below.

Referring to FIG. 9, the fourth device isolating layer 144 may include an upper region, an intermediate region and a lower region. The width W1 of the upper region may be greater than the width W2 of the intermediate region, and the width W2 of the intermediate region may be greater than the width W4 of the lower region. As illustrated, the lower region of the fourth device isolating layer 144 may be formed on the side surface of the third device isolating layer 140. The third device isolating layer 140 and the fourth device isolating layer 144 may enhance the gap fill properties.

Figure 10:
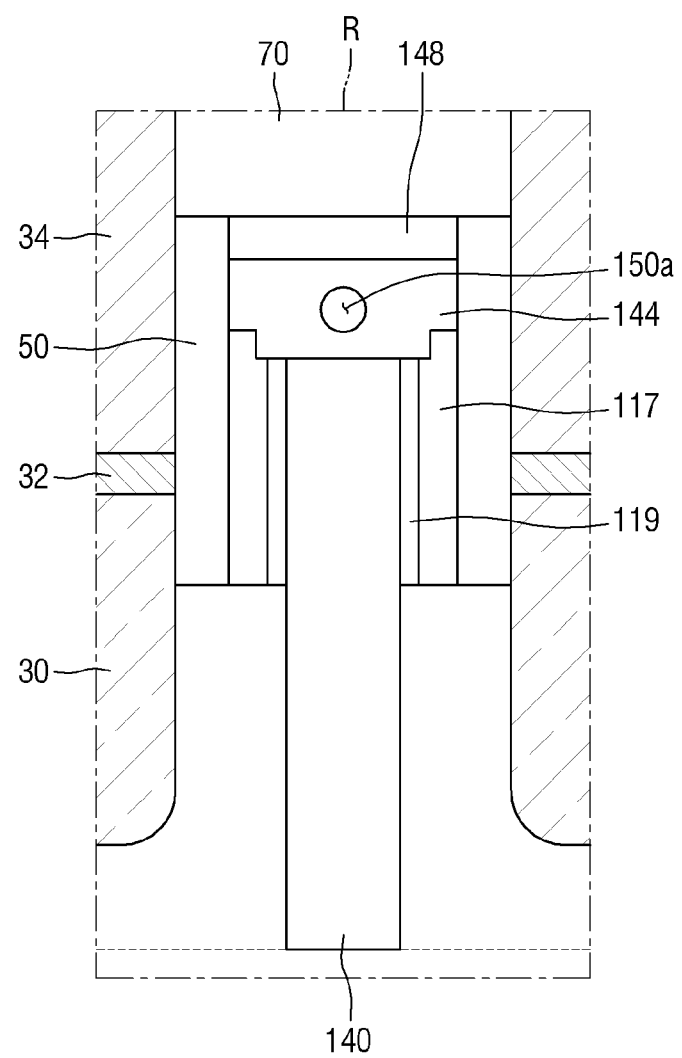
FIG. 10 is a cross-sectional view of a semiconductor device according to some example embodiments.

FIG. 10 is a cross-sectional view of a semiconductor device according to some example embodiments. For convenience of explanation, differences that are not explained above with reference to FIGS. 1 to 7 will be mainly explained below.

Referring to FIG. 10, the fourth device isolating layer 144 may include an air gap 150a. The air gap 150a may be formed by forming the fourth device isolating layer 144 using a method with poor step coverage. The fourth device isolating layer 144 including the air gap 150a may improve the device isolation characteristics.

Although FIG. 10 illustrates the fourth device isolating layer 144 including the air gap 150a, but example embodiments are not limited thereto. According to some example embodiments, the air gap 150a may be formed in the third device isolating layer 140. Further, the air gap 150a may be formed in both the third device isolating layer 140 and the fourth device isolating layer 144.

FIGS. 11 to 16 are cross-sectional views of semiconductor devices according to some example embodiments. For convenience of explanation, differences that are not explained above with reference to FIGS. 1 to 5 will be mainly explained below.

As illustrated in FIG. 5, the cross-section of the third trench T3 may be in a rectangular shape, but example embodiments are not limited thereto. Accordingly, the third trench T3 may have the cross-section in a variety of shapes, as illustrated in FIGS. 11 to 16.

Figure 11:
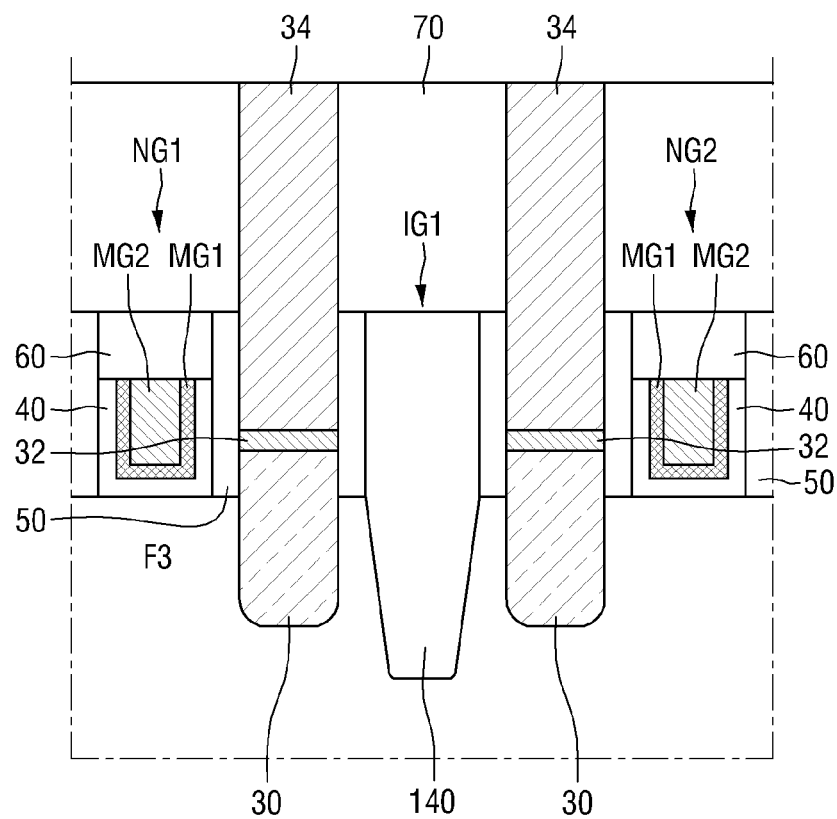
FIGS. 11 to 16 are cross-sectional views of a semiconductor device according to some example embodiments.
Figure 12:
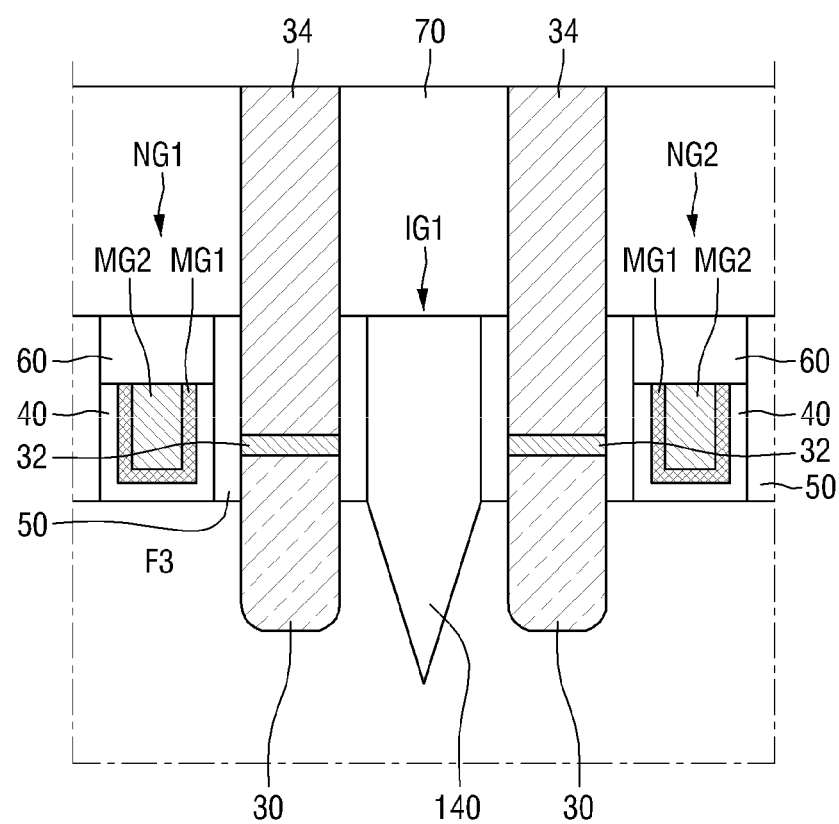
Figure 13:
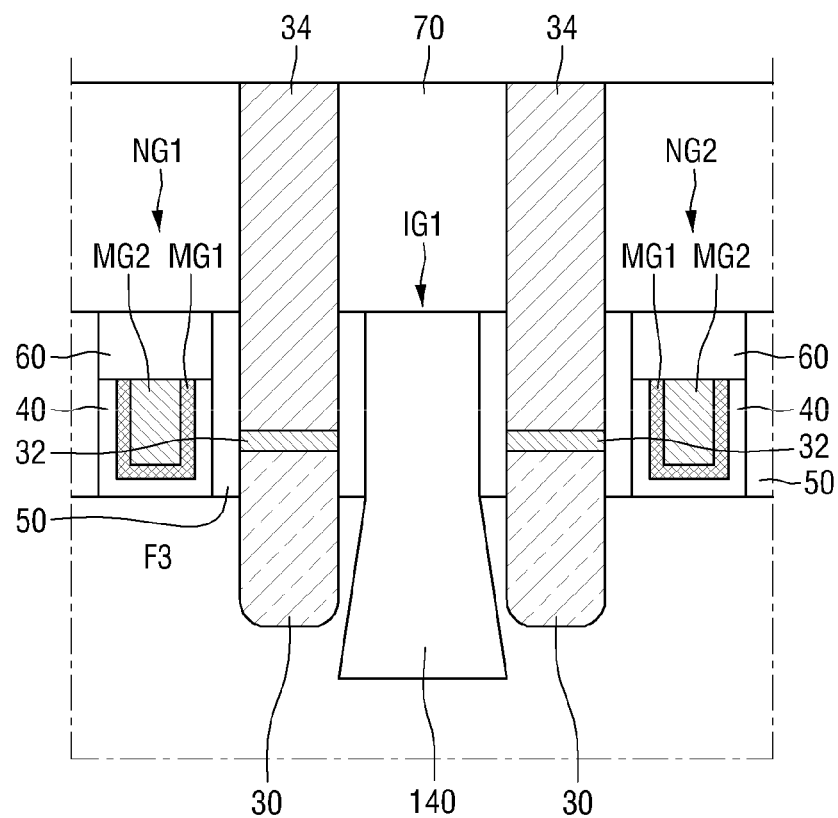
Figure 14:
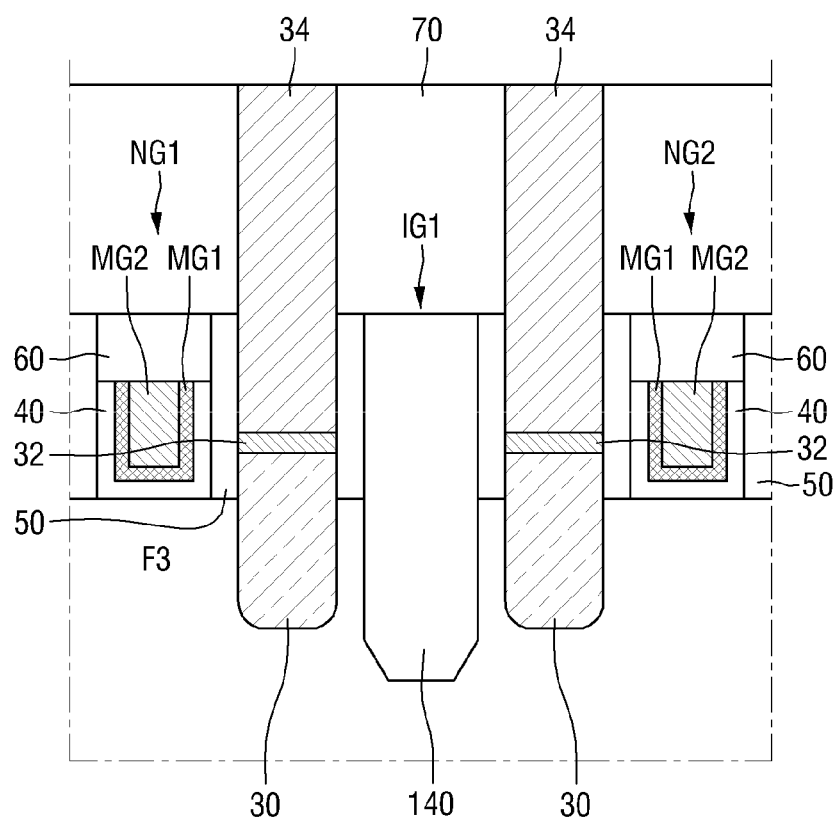
Figure 15:
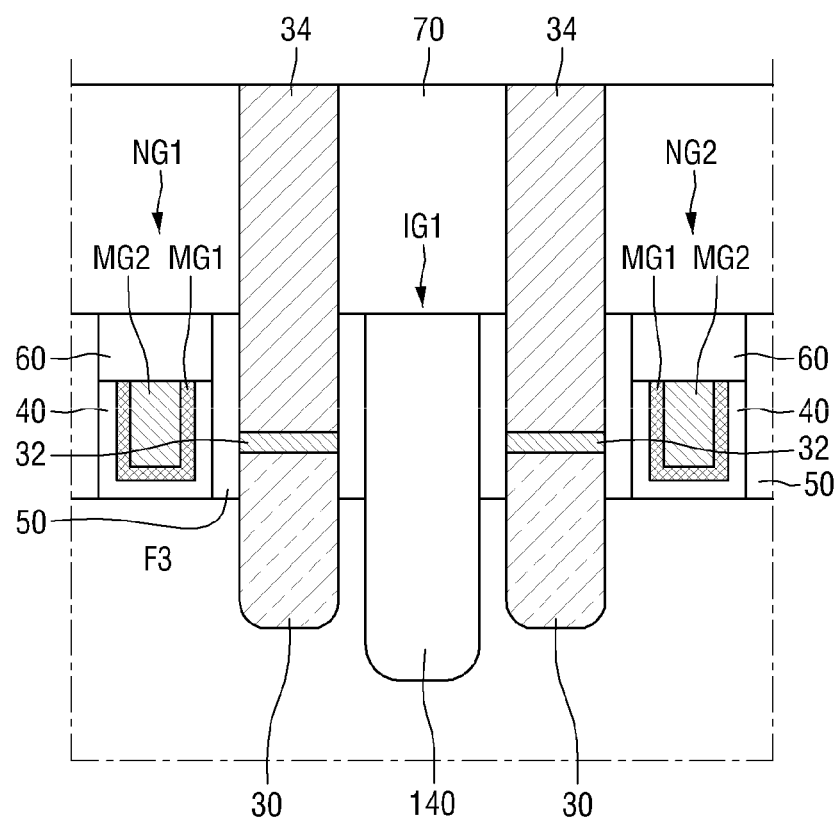
Figure 16:
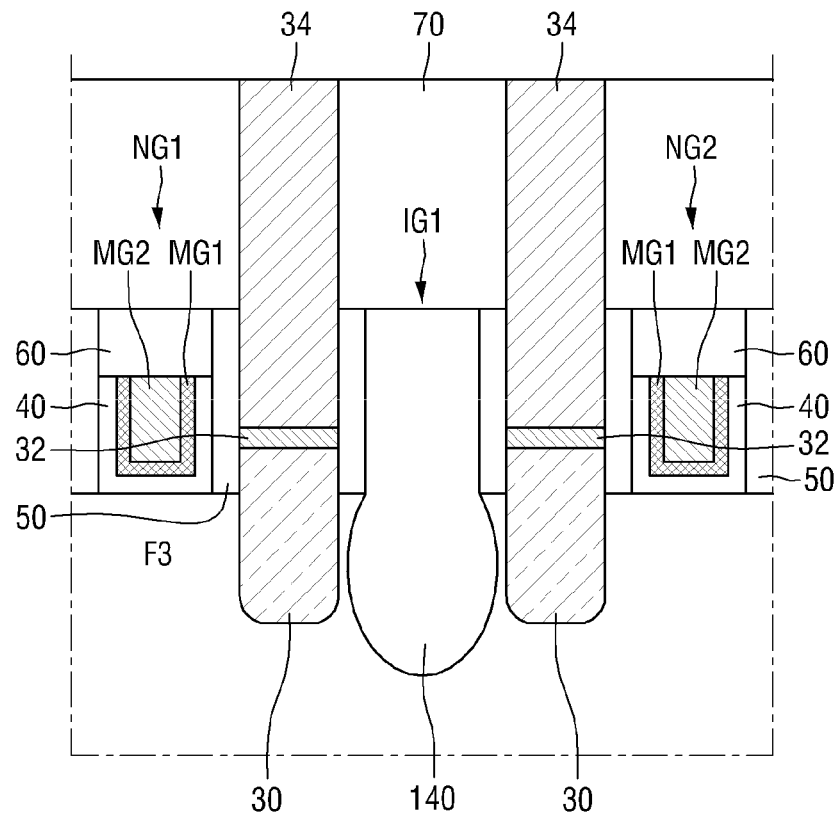

As illustrated in FIG. 11, the third trench T3 may have the width that is decreased (e.g., gradually) in a direction from the upper portion to the lower portion. In some embodiments, a lower portion of the third trench T3 may have a V-shape (e.g., shape illustrated in FIG. 12), a trapezoidal shape having a wider width at a lower portion (e.g., shape illustrated in FIG. 13), a U-shape of which a lower portion is angular (e.g., shape illustrated in FIG. 14), or an elliptical shape with bulging lower portion (e.g., shape illustrated in FIG. 16). However, example embodiments are not limited to. Accordingly, the third trench T3 may have shapes different from those shown in FIGS. 11 to 15.

Figure 17:
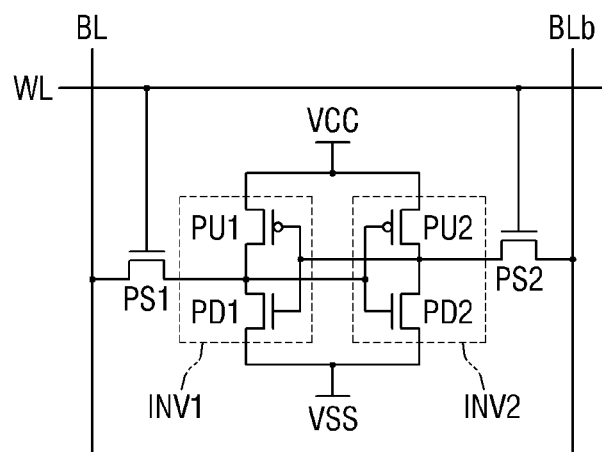
FIG. 17 is a circuit diagram of a semiconductor device according to some example embodiments.
Figure 18:
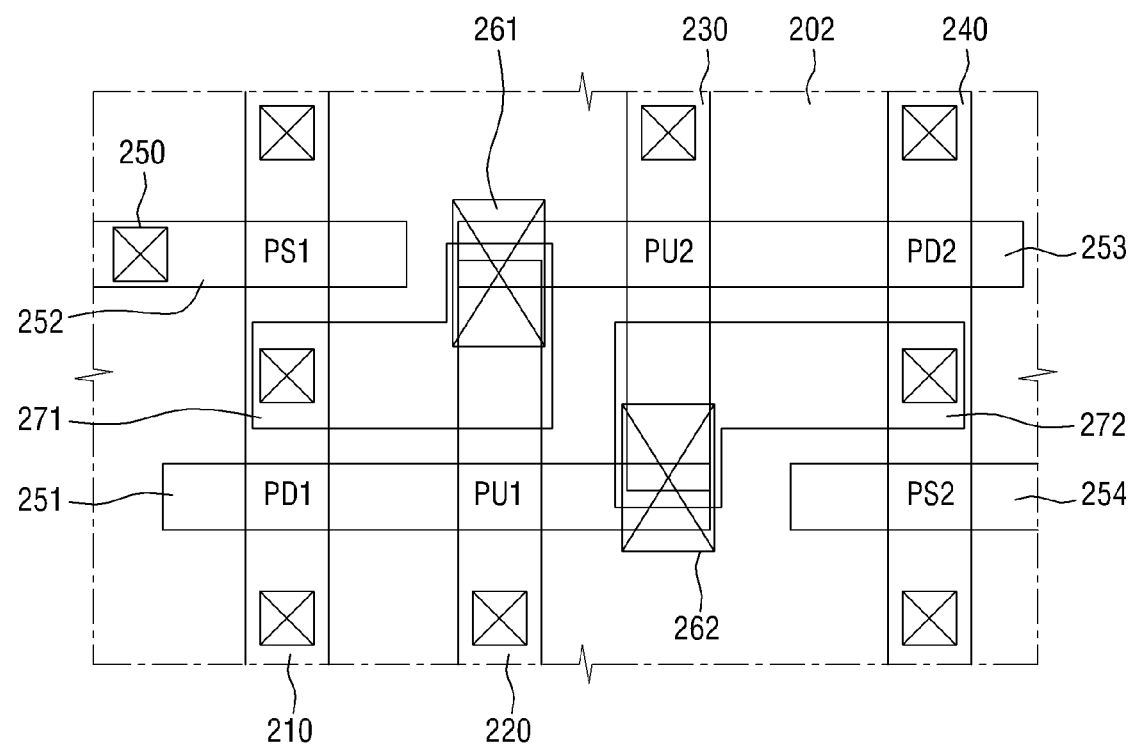
FIG. 18 is a layout diagram of the semiconductor device of FIG. 17.

FIG. 17 is a circuit diagram of a semiconductor device according to some example embodiments. FIG. 18 is a layout diagram of the semiconductor device of FIG. 17.

Referring to FIG. 17, the semiconductor device may include a pair of inverters INV1, INV2 connected in parallel between a power node Vcc and a ground node Vss, and a first pass transistor PS1 and a second pass transistor PS2 connected respectively to output nodes of the inverters INV1, INV2. The first pass transistor PS1 and the second pass transistor PS2 may be connected to a bit line BL and a complementary bit line BLb, respectively. The gates of the first pass transistor PS1 and the second pass transistor PS2 may be connected to a word line WL.

The first inverter INV1 includes a first transistor PU1 and a first pull-down transistor PD1 connected in series, and the second inverter INV2 includes a second pull-up transistor PU2 and a second pull-down transistor PD2 connected in series. The first pull-up transistor PU1 and the second pull-up transistor PU2 may be PFET transistors, and the first pull-down transistor PD1 and the second pull-down transistor PD2 may be NFET transistors.

Further, in order for the first inverter INV1 and the second inverter INV2 to construct one latch circuit, the input node of the first inverter INV1 may be connected to the output node of the second inverter INV2, and the input node of the second inverter INV2 may be connected to the output node of the first inverter INV1.

Figure 20:
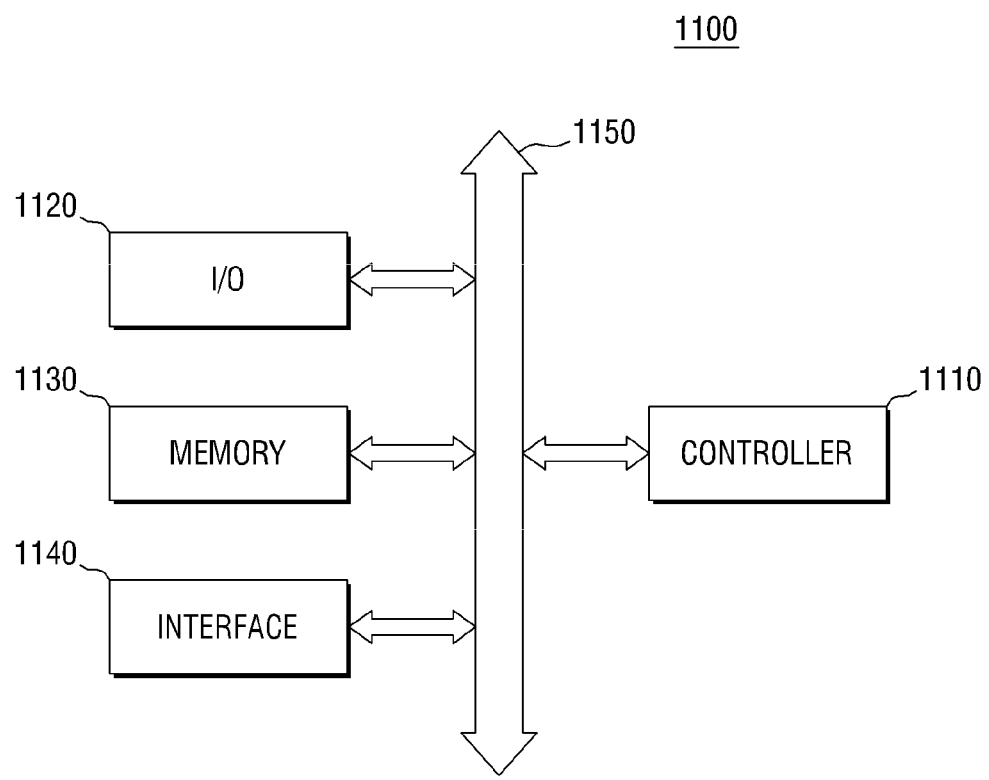
FIG. 20 is a block diagram of an electronic system comprising a semiconductor device according to some example embodiments.

Referring to FIGS. 17 and 18, a first active fin 210, a second active fin 220, a third active tin 230 and a fourth active tin 240, which are spaced from each other, are elongated in one direction (e.g., longitudinal direction in FIG. 20). The elongated lengths of the second active fin 220 and the third active fin 230 may be shorter than the elongated lengths of the first active fin 210 and the fourth active fin 240.

Further, a first gate electrode 251, a second gate electrode 252, a third gate electrode 253 and a fourth gate electrode 254 are elongated in the other direction (e.g., transversal direction in FIG. 20), intersecting the first active fin 210 to the fourth active fin 240. Specifically, the first gate electrode 251 may completely intersect the first active fin 210 and the second active fin 220, while partially overlapping an end of the third active fin 230. The third gate electrode 253 may completely intersect the fourth active fin 240 and the third active fin 230, while partially overlapping an end of the second active fin 220. The second gate electrode 252 and the fourth gate electrode 254 are formed so as to intersect the first active fin 210 and the fourth active fin 240, respectively.

As illustrated, the first pull-up transistor PU1 is defined near an intersecting region between the first gate electrode 251 and the second active fin 220, the first pull-down transistor PD1 is defined near an intersecting region between the first gate electrode 251 and the first active fin 210, and the first pass transistor PS1 is defined near an intersecting region between the second gate electrode 252 and the first active fin 210. The second pull-up transistor PU2 is defined near an intersecting region between the third gate electrode 253 and the third active fin 230, the second pull-down transistor PD2 is defined near an intersecting region between the third gate electrode 253 and the fourth active fin 240, and the second pass transistor PS2 is defined near an intersecting region between the fourth gate electrode 254 and the fourth active fin 240.

Although not explicitly illustrated, the source/drain may be formed on both sides of the intersecting regions between the first to fourth gate electrodes 251~254 and the first to fourth active fin 210, 220, 230, 240, and a plurality of contacts 250 may also be formed.

Furthermore, a first shared contact 261 connects the second active fin 220, the third gate line 253 and a wire 271. A second shared contact 262 connects the third active fin 230, the first gate line 251 and a wire 272.

At least one of the semiconductor devices of some example embodiments described above may be employed in such SRAM layout.

Figure 19:
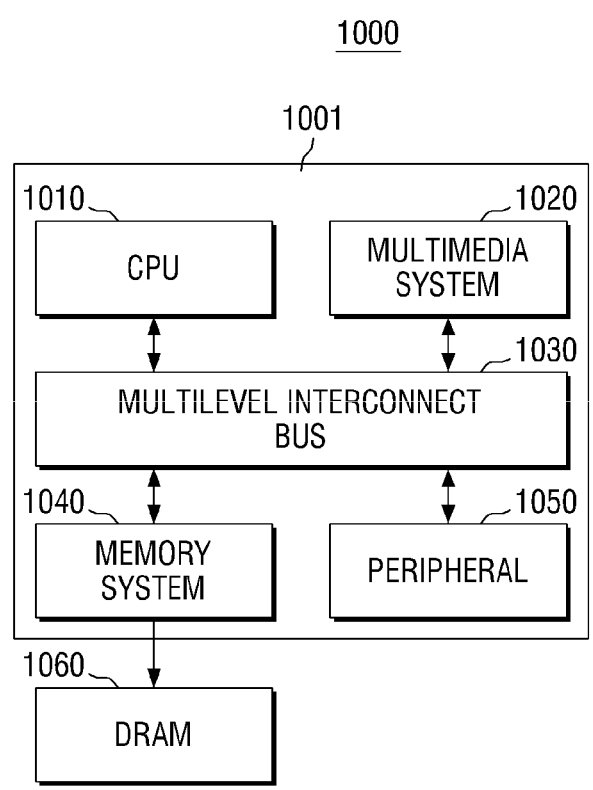
FIG. 19 is a block diagram of a SoC system comprising a semiconductor device according to some example embodiments.

FIG. 19 is a block diagram of a SoC system comprising a semiconductor device according to some example embodiments.

Referring to FIG. 19, a SoC system 1000 may include an application processor 1001 and a dynamic random-access memory (DRAM) 1060.

The application processor 1001 may include a central processing unit (CPU) 1010, a multimedia system 1020, a bus 1030, a memory system 1040 and a peripheral circuit 1050.

The CPU 1010 may perform arithmetic operation necessary for the driving of the SoC system 1000. In some example embodiments, the CPU 1010 may be configured on a multi-core environment which includes a plurality of cores.

The multimedia system 1020 may be used for performing a variety of multimedia functions at the SoC system 1000. The multimedia system 1020 may include a three-dimensional (3D) engine module, a video codec, a display system, a camera system, or a post-processor.

The bus 1030 may be used for exchanging data communication among the CPU 1010, the multimedia system 1020, the memory system 1040 and the peripheral circuit 1050. In some example embodiments, the bus 1030 may have a multi-layer structure. Specifically, an example of the bus 1030 may be a multi-layer advanced high-performance bus (AHB), or a multi-layer advanced eXtensible interface (AXI), although example embodiments are not limited hereto.

The memory system 1040 may provide environments necessary for the application processor 1001 to connect to an external memory (e.g., DRAM 1060) and perform high-speed operation. In some example embodiments, the memory system 1040 may include a separate controller (e.g., DRAM controller) to control an external memory (e.g., DRAM 1060).

The peripheral circuit 1050 may provide environments necessary for the SoC system 1000 to have a seamless connection to an external device (e.g., main board). Accordingly, the peripheral circuit 1050 may include a variety of interfaces to allow compatible operation with the external device connected to the SoC system 1000.

The DRAM 1060 may function as an operation memory necessary for the operation of the application processor 1001. In some example embodiments, the DRAM 1060 may be arranged externally to the application processor 1001, as illustrated. Specifically, the DRAM 1060 may be packaged into a package on package (PoP) type with the application processor 1001.

At least one of the components of the SoC system 1000 may include at least one of semiconductor devices according to some example embodiments.

FIG. 20 is a block diagram of an electronic system comprising a semiconductor device according to some example embodiments.

Referring to FIG. 20, the electronic system 1100 according to some example embodiments may include a controller 1110, an input/output (I/O) device 1120, a memory device 1130, an interface 1140 and a bus 1150. The controller 1110, the I/O device 1120, the memory device 1130 and/or the interface 1140 may be coupled with one another via the bus 1150. The bus 1150 corresponds to a path through which data travels.

The controller 1110 may include at least one of microprocessor, digital signal processor, micro controller and logic devices capable of performing functions similar to those mentioned above. The I/O device 1120 may include, for example, a keypad, a keyboard or a display device. The memory device 1130 may store data and/or commands. The interface 1140 may perform a function of transmitting data to, or receiving data from the communication networks. The interface 1140 may be wired or wireless. For example, the interface 1140 may include an antenna or a wired/wireless transceiver.

Although not illustrated, the electronic system 1100 may additionally include an operation memory configured to enhance operation of the controller 1110, such as a high-speed DRAM and/or a static random access memory (SRAM).

According to some example embodiments described above, the semiconductor device may be provided within the memory device 1130, or provided as a part of the controller 1110 or the I/O device 1120.

The electronic system 1100 is applicable to a personal digital assistant (PDA) portable computer, a web tablet, a wireless phone, a mobile phone, a digital music player, a memory card, or almost all electronic products that are capable of transmitting and/or receiving data in wireless environment.

Figure 21:
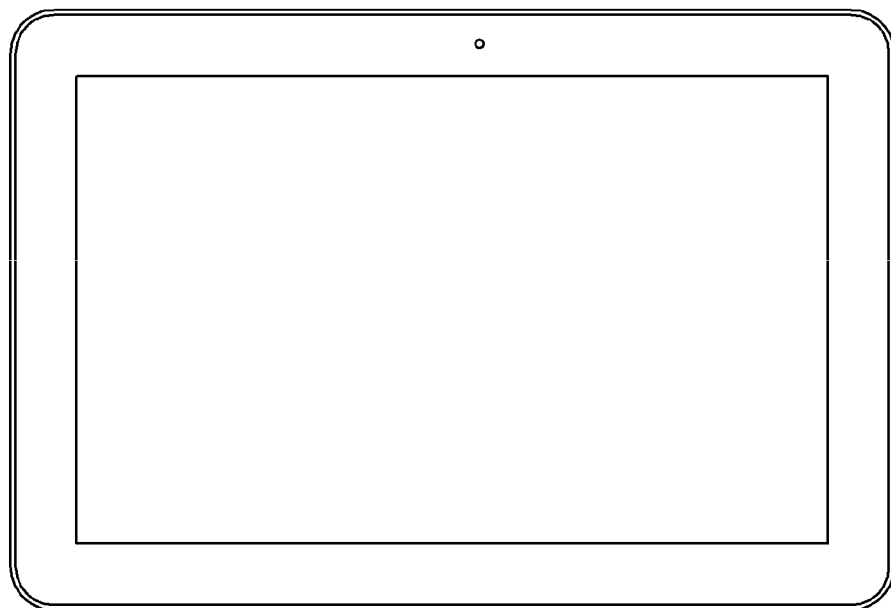
FIGS. 21 to 23 illustrate example semiconductor systems that include a semiconductor device according to some example embodiments.
Figure 22:
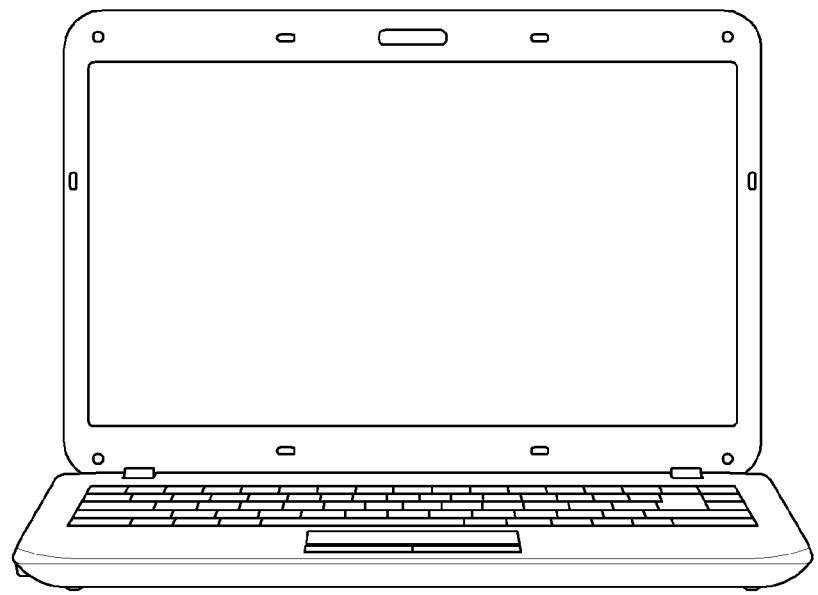
Figure 23:
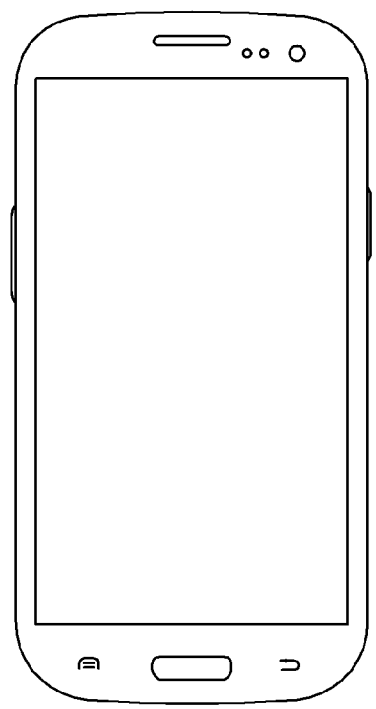

FIGS. 21 to 23 illustrate example semiconductor systems that include a semiconductor device according to some example embodiments.

FIG. 21 illustrates a tablet PC 1200, FIG. 22 illustrates a laptop computer 1300, and FIG. 23 illustrates a smartphone 1400. A semiconductor device fabricated with methods according to example embodiments may be used in these devices, i.e., the tablet PC 1200, the laptop computer 1300 or the smartphone 1400.

Further, it is apparent to those skilled in the art that the semiconductor device according to example embodiments is applicable to another integrated circuit device not illustrated herein. That is, while the tablet PC 1200, the laptop computer 1300 and the smartphone 1400 are exemplified herein as a semiconductor system according to example embodiments, the example embodiments of the semiconductor system are not limited to any of the examples given above.

In some example embodiments, the semiconductor system may be realized as a computer, a ultra mobile PC (UMPC), a workstation, a net-book, personal digital assistants (PDA), a portable computer, a wireless phone, a mobile phone, an e-book, a portable multimedia player (PMP), a portable game player, a navigation device, a black box, a digital camera, a three-dimensional television, a digital audio recorder, a digital audio player, a digital picture recorder, a digital picture player, a digital video recorder, or a digital video player.

Herein below, a method of fabricating a semiconductor device according to some example embodiments will be explained with reference to FIGS. 24 to 32, and FIG. 3, FIGS. 24 to 32 are cross-sectional views illustrating a method of fabricating a semiconductor device according to some example embodiments.

Figure 24:
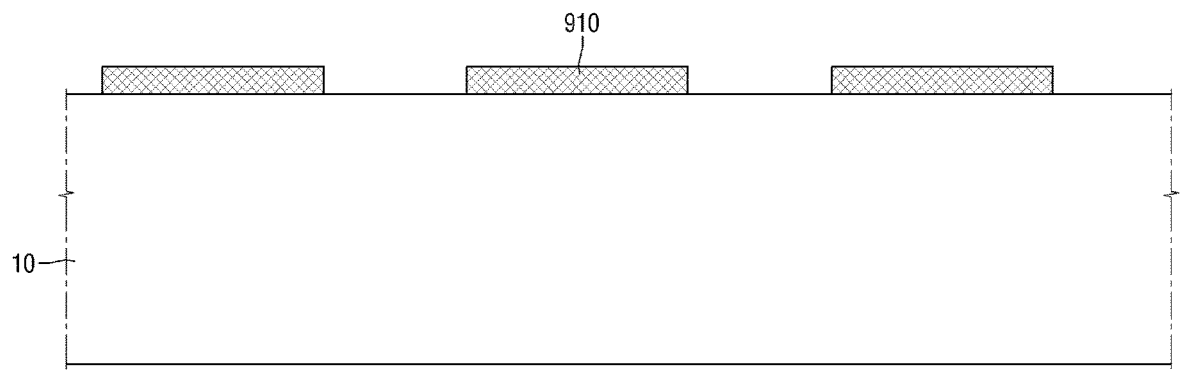
FIGS. 24 to 32 are cross-sectional views illustrating a method of forming a semiconductor device according to some example embodiments.

Referring first to FIG. 24, a first hard mask 910 is formed on the substrate 10.

Figure 25:
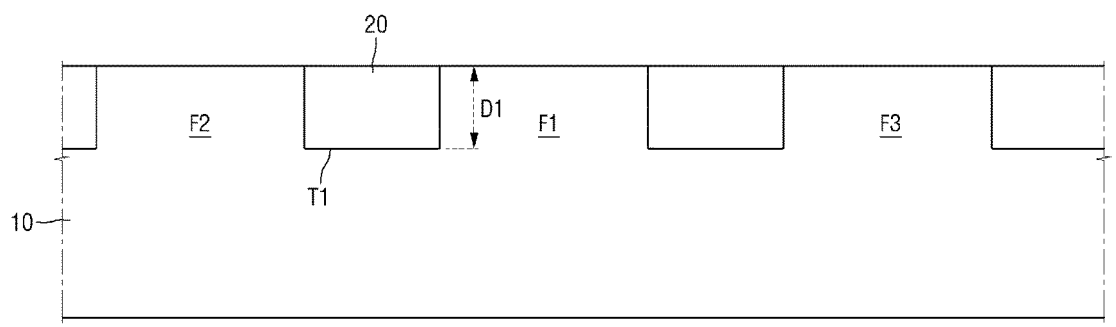

Referring to FIG. 25, the fins F1, F2, F3 may be formed by etching the substrate 10 using the first hard mask 910 as an etch mask and thus forming the first trench T1 having the first depth D1. The first trench T1 may separate the fins F1, F2, F3 from one another.

The first device isolating layer 20 may be formed in the first trench T1 and may be on sides of the fins F1, F2, F3.

In some embodiments, the first device isolating layer 20 may have superior gap fill properties. The first device isolating layer 20 may include, for example, a TOSZ or FCVD oxide.

The first hard mask 910 may be removed after forming the first trench T1.

Figure 26:
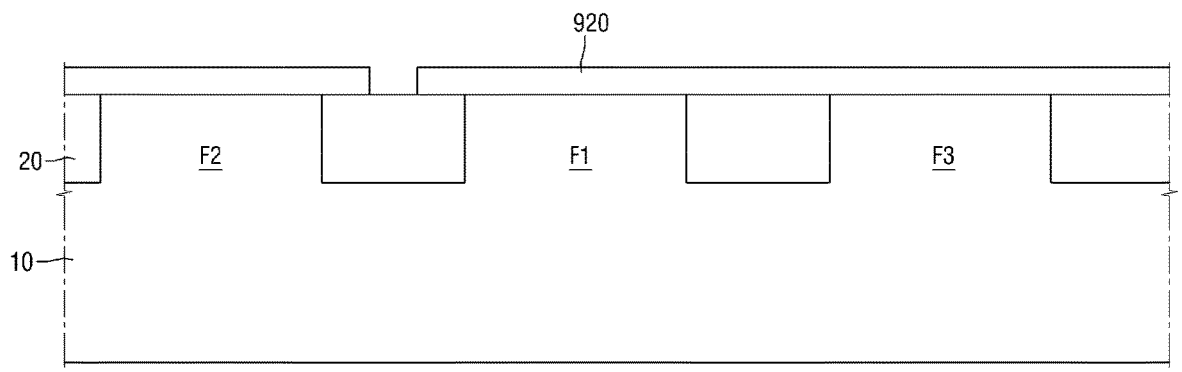

Referring to FIG. 26, a second hard mask 920 may be formed on the first device isolating layer 20 and the substrate including fins F1, F2, F3.

Figure 27:
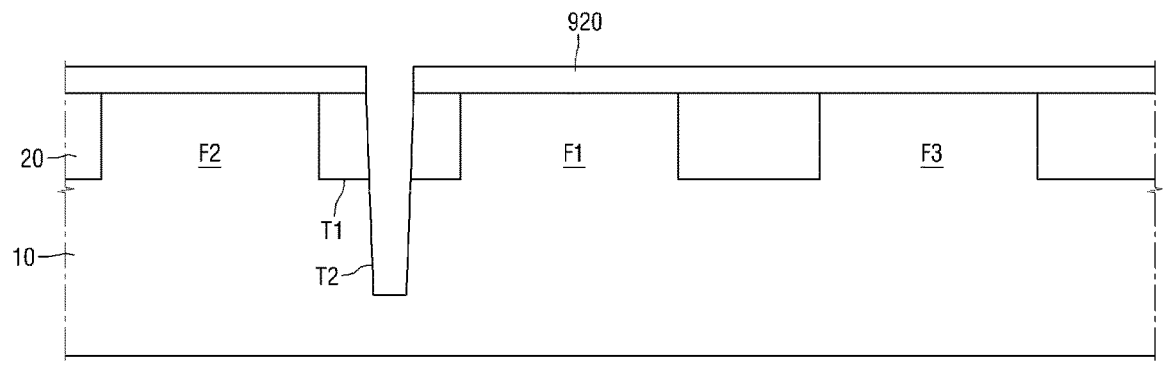

Referring to FIG. 27, the second trench T2 may be formed to have the second depth D2 that is greater than the first depth D1 by etching the first device isolating layer 20 and the substrate underlying the first device isolating layer 20 using the second hard mask 920 as an etch mask.

A portion of the second trench T2 may be overlapped with the first trench T1 in plan view. The second trench T2 may be in the first trench and may extend through the first device isolating layer 20 as illustrate in FIG. 27.

Figure 28:
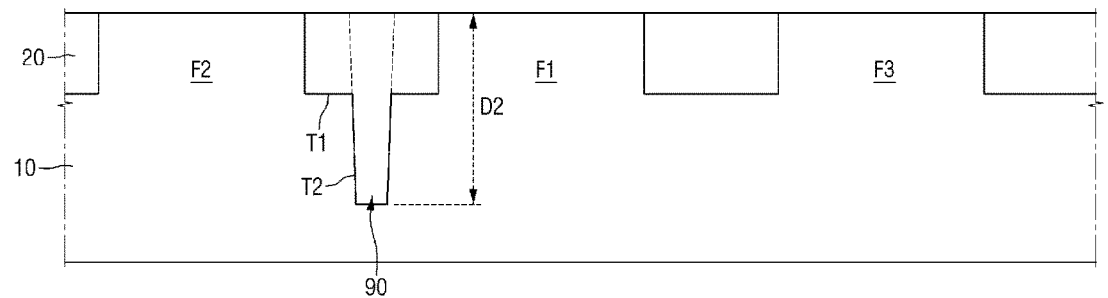

Referring to FIG. 28, the second device isolating layer 90 may be formed in the second trench T2.

Because a portion of the second trench T2 is overlapped with the first trench T1 in plan view, an upper portion of the second device isolating layer 90 may be directly contacted with the first device isolating layer 20. In some embodiments, upper surfaces of the first device isolating layer 20 and the second device isolating layer 90 may be coplanar as illustrated in FIG. 28.

In some embodiments, the second device isolating layer 90 may have a lower shrink rate than those of the first device isolating layer 20 and the third device isolating layer IG1. The second device isolating layer 90 may include, for example, a high density plasma (HDP) oxide or an undoped silicate glass (USG) oxide.

The second hard mask 920 may be removed after the second device isolating layer 90 is formed.

Figure 29:
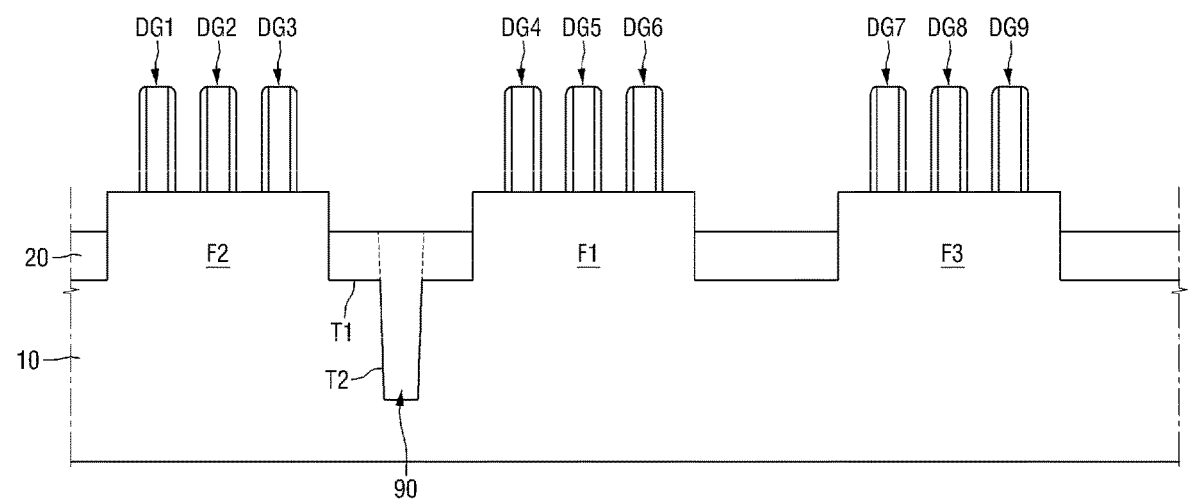

Referring to FIG. 29, the upper surface of the first device isolating layer 20 and the upper surface of the second device isolating layer 90 may be lowered slightly, as a portion of the first device isolating layer 20 and a portion of the second device isolating layer 90 are etched, Portion of the sidewalls of the fins F1, F2, F3 may be exposed.

A plurality of dummy gates DG1~DG9 may be formed on the fins F1, F2, F3. The plurality of dummy gates DG1~DG9 may traverse the fins F1, F2, F3. For example, the dummy gates DG1~DG9 may include silicon. Dummy spacers may be formed on the sidewalls of the lower portions of the dummy gates DG1~DG9.

Figure 30:
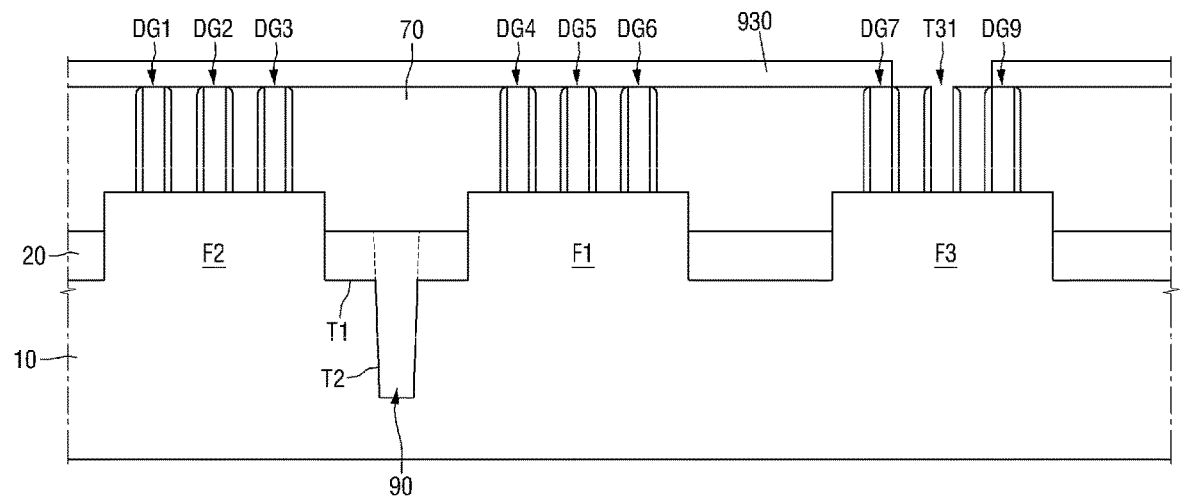

Referring to FIG. 30, the source/drain regions (not illustrated) may be formed on both sides of the dummy gates DG1~DG9. In some embodiments, the source/drain regions may be formed by removing portions of the fins F1, F2, F3 and then growing stress materials (e.g., SiG, SiC or SiP) using an epitaxial growth process.

The interlayer insulating layer 70 may be formed on the first device isolating layer 20, the second device isolating layer 90 and the plurality of dummy gates DG1~DG9 after forming the source/drain regions.

The third hard mask 930 may be formed on the interlayer insulating layer 70.

A preliminary trench T31 may be formed by removing at least one dummy gate (e.g., DG8) using the third hard mask 930 as an etch mask.

Figure 31:
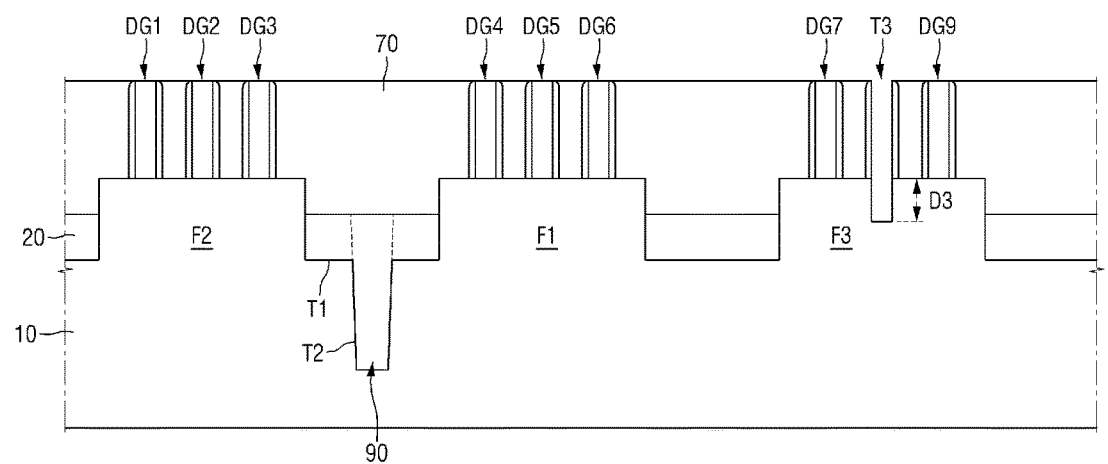

Referring to FIG. 31, the third trench T3 may be formed by further removing a portion of the fin F3. The third depth D3 of the third trench T3 from an upper surface of the fin F3 may be less than the first depth D1 of the first trench T1 from the upper surface of the fin F3. The width of the third trench T3 may be less than the width of the first trench T1.

The third hard mask 930 may be removed after forming the third trench T3.

Figure 32:
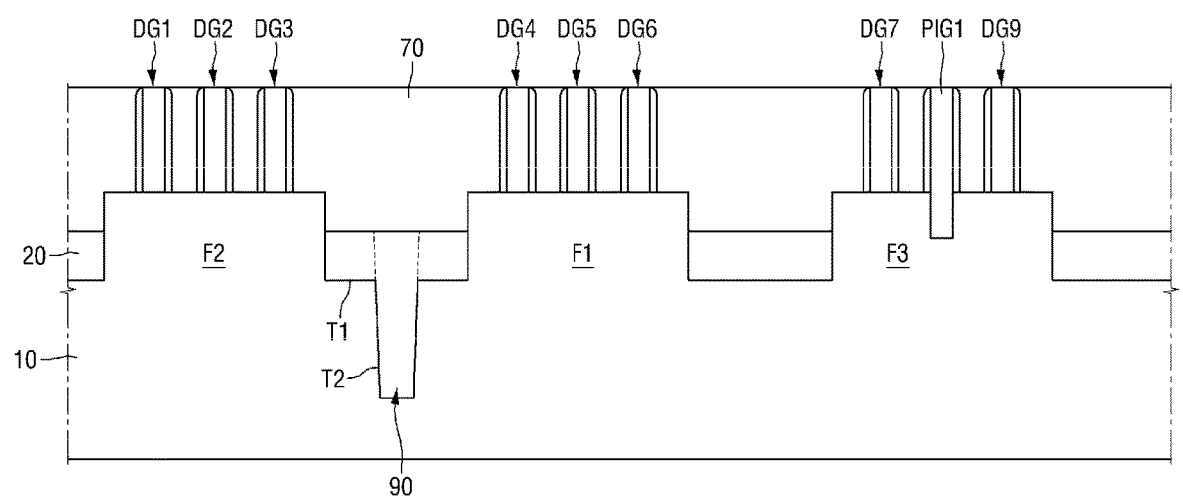

Referring to FIG. 32, a preliminary third device isolating layer PIG1 may be formed in the third trench T3.

The preliminary third device isolating layer may have superior gap fill properties, considering the narrow width of the third trench T3. In some embodiments, the preliminary third device isolating layer PIG1 may include a material that may not require a high temperature treatment.

The preliminary third device isolating layer PIG1 may include, for example, nitride.

In some embodiments, the preliminary third device isolating layer PIG1 may include TOSZ or FCVD. After a TOSZ or FCVD oxide is formed in the first trench T1, an annealing process may be performed at a high temperature (e.g., 1000° C. or above). As a result, the first device isolating layer 20 may be formed. In some embodiments, after a TOSZ or FCVD oxide is formed in the third trench T3, an annealing process at a low temperature (e.g., 700° C. or below) may be performed. As a result, the preliminary third device isolating layer PIG1 may be formed.

Referring again to FIG. 3, upper portions of the structure illustrated in FIG. 32 may be removed by, for example, a planarization process. As a result, the heights of the dummy gates DG1~DG7, DG9 and the height of the preliminary third device isolating layer PIG1 may decrease.

The dummy gates DG1~DG7, DG9 may be removed. The first metal layer MG1 and the second metal layer MG2 may be formed in spaces from which the dummy gates DG1~DG7, DG9 are removed. In some embodiments, the first metal layer MG1 and the second metal layer MG2 may fill the spaces from which the dummy gates DG1~DG7, DG9 are removed. The first metal layer MG1 may play a role of adjusting a work function, and the second metal layer MG2 may play a role of filling a space defined by the first metal layer MG1.

The upper surfaces of the source/drain regions 30 may be exposed by removing portions of the interlayer insulating layer 70.

Then, the silicide layer 32 may be formed on the upper surfaces of the source/drain regions 30.

The contact 34 including a conductive material may be formed on the silicide layer 32. While the present inventive concept has been particularly shown and described with reference to example embodiments thereof, it will be understood by those of ordinary skill in the art that various changes in form and details may be made therein without departing from the spirit and scope of the present inventive concept as defined by the following claims. Therefore, the example embodiments are to be considered illustrative and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
   a first trench having a first depth and defining a fin;
   a first source/drain region and a second source/drain region on the fin;
   a second trench in the fin and between the first source/drain region and the second source/drain region, the second trench having a second depth that is different from the first depth;
   a first device isolation layer in the first trench; and
   a second device isolation layer in the second trench,
   wherein the second device isolation layer includes three isolation layers,
   wherein the second device isolation layer includes a first isolation liner extending along a bottom of the second trench and a sidewall of the second trench, a second isolation liner on the first isolation liner and extending along the first isolation liner, and an upper isolation layer on the second isolation liner,
   wherein the second isolation liner defines a liner recess,
   wherein the upper isolation layer is in the liner recess, and
   wherein the second depth is greater than each of a distance between an upper surface of the fin to a lowermost end of the first source/drain region and a distance between the upper surface of the fin to a lowermost end of the second source/drain region.

2. The semiconductor device of claim 1, wherein the first isolation liner includes a side portion on the sidewall of the second trench and a bottom portion on the bottom of the second trench, and
   wherein a distance between the upper surface of the fin to the bottom portion of the first isolation liner is greater than the distance between the upper surface of the fin to the lowermost end of the first source/drain region.

3. The semiconductor device of claim 1, wherein the second trench comprises a lower portion comprising opposing sides that are laterally bulging.

4. The semiconductor device of claim 1, wherein a height from the bottom of the second trench to an uppermost end of the second isolation liner is equal to a height from the bottom of the second trench to an uppermost end of the first isolation liner.

5. The semiconductor device of claim 1, wherein the second device isolation layer consists of the three isolation layers.

6. The semiconductor device of claim 1, wherein the first trench has a first width, and the second trench has a second width that is narrower than the first width.

7. A semiconductor device comprising:
   a first trench having a first depth and defining a fin;
   a first source/drain region and a second source/drain region on the fin;
   a second trench in the fin and between the first source/drain region and the second source/drain region, the second trench having a second depth that is different from the first depth;
   a first device isolation layer in the first trench; and
   a second device isolation layer in the second trench, wherein the second device isolation layer includes three isolation layers.

8. The semiconductor device of claim 7, wherein the second device isolation layer includes a first isolation liner, a second isolation liner on the first isolation liner, and an upper isolation layer on the second isolation liner, and
wherein a height from a bottom of the second trench to an uppermost end of the second isolation liner is greater than a height from the bottom of the second trench to a lowermost end of the upper isolation layer.

9. The semiconductor device of claim 8, wherein the height from the bottom of the second trench to the uppermost end of the second isolation liner is equal to a height from the bottom of the second trench to an uppermost end of the first isolation liner.

10. The semiconductor device of claim 7, wherein the second device isolation layer includes an isolation liner contacting the fin, and
wherein the isolation liner extends along a bottom of the second trench and a sidewall of the second trench.

11. The semiconductor device of claim 10, wherein the isolation liner includes a side portion on the sidewall of the second trench and a bottom portion on the bottom of the second trench, and
wherein a distance between an upper surface of the fin to the bottom portion of the isolation liner is greater than a distance between the upper surface of the fin to a lowermost end of the first source/drain region.

12. The semiconductor device of claim 7, wherein the second depth is greater than each of a distance between an upper surface of the fin to a lowermost end of the first source/drain region and a distance between the upper surface of the fin to a lowermost end of the second source/drain region.

13. The semiconductor device of claim 7, wherein the second trench comprises a lower portion comprising opposing sides that are laterally bulging.

14. A semiconductor device comprising:
a first trench having a first depth and defining a fin;
a first source/drain region and a second source/drain region on the fin;
a second trench in the fin and between the first source/drain region and the second source/drain region, the second trench having a second depth that is different from the first depth;
a first device isolation layer in the first trench; and
a second device isolation layer in the second trench,
wherein the second device isolation layer consists of three isolation layers,
wherein the second device isolation layer includes a first isolation liner extending along a bottom of the second trench and a sidewall of the second trench, a second isolation liner on the first isolation liner and extending along the first isolation liner, and an upper isolation layer on the second isolation liner,
wherein the second isolation liner defines a liner recess, and
wherein the upper isolation layer is in the liner recess.

15. The semiconductor device of claim 14, wherein the second depth is greater than each of a distance between an upper surface of the fin to a lowermost end of the first source/drain region and a distance between the upper surface of the fin to a lowermost end of the second source/drain region.

16. The semiconductor device of claim 14, wherein the first isolation liner includes a side portion on the sidewall of the second trench and a bottom portion on the bottom of the second trench, and
wherein a distance between an upper surface of the fin to the bottom portion of the first isolation liner is greater than a distance between the upper surface of the fin to a lowermost end of the first source/drain region.

17. The semiconductor device of claim 14, wherein a height from the bottom of the second trench to an uppermost end of the second isolation liner is equal to a height from the bottom of the second trench to an uppermost end of the first isolation liner.

18. The semiconductor device of claim 14, wherein the second trench comprises a lower portion comprising opposing sides that are laterally bulging.

19. The semiconductor device of claim 14, wherein the first trench has a first width, and the second trench has a second width that is narrower than the first width.

* * * * *